United States Patent
Babulano et al.

(10) Patent No.: US 10,168,391 B2
(45) Date of Patent: Jan. 1, 2019

(54) MULTI-FUNCTIONAL INTERCONNECT MODULE AND CARRIER WITH MULTI-FUNCTIONAL INTERCONNECT MODULE ATTACHED THERETO

(71) Applicant: Infineon Technologies AG, Neubiberg (DE)

(72) Inventors: Giuliano Angelo Babulano, Ottobrunn (DE); Jens Oetjen, Ottenhofen (DE); Liu Chen, Munich (DE); Toni Salminen, Munich (DE); Stefan Mieslinger, Kottgeisering (DE); Markus Dinkel, Unterhaching (DE); Martin Gruber, Schwandorf (DE); Franz Jost, Stuttgart (DE); Thorsten Meyer, Regensburg (DE); Rainer Schaller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 223 days.

(21) Appl. No.: 15/049,923

(22) Filed: Feb. 22, 2016

(65) Prior Publication Data

US 2016/0377689 A1   Dec. 29, 2016

Related U.S. Application Data

(63) Continuation-in-part of application No. 14/947,649, filed on Nov. 20, 2015, now Pat. No. 9,564,578, (Continued)

(51) Int. Cl.
*H01L 25/16* (2006.01)
*G01R 33/00* (2006.01)
(Continued)

(52) U.S. Cl.
CPC ....... *G01R 33/0047* (2013.01); *G01R 33/091* (2013.01); *H01L 43/02* (2013.01); *H01L 43/08* (2013.01)

(58) Field of Classification Search
CPC ... G01R 33/0047; G01R 33/091; H01L 43/02; H01L 43/08
(Continued)

(56) References Cited

U.S. PATENT DOCUMENTS 7,199,435 B2   4/2007   Elbanhawy
7,545,136 B2 *  6/2009   Racz ................... G01R 15/207
                                                         324/115
(Continued)

FOREIGN PATENT DOCUMENTS

DE   102007044485 A1   4/2009
DE   102013103351 A1   10/2013
(Continued)

*Primary Examiner* — Viet Q Nguyen
(74) *Attorney, Agent, or Firm* — Murphy, Bilak & Homiller, PLLC

(57) ABSTRACT

An interconnect module includes a metal clip having a first end section, a second end section and a middle section extending between the first and the second end sections. The first end section is configured for external attachment to a bare semiconductor die or packaged semiconductor die attached to a carrier or to a metal region of the carrier. The second end section is configured for external attachment to a different metal region of the carrier or to a different semiconductor die or packaged semiconductor die attached to the carrier. The module further includes a magnetic field sensor secured to the metal clip. The magnetic field sensor is operable to sense a magnetic field produced by current flowing through the metal clip. The interconnect module can
(Continued)

be used to form a direct electrical connection between components and/or metal regions of a carrier to which the module is attached.

25 Claims, 42 Drawing Sheets

Related U.S. Application Data which is a continuation of application No. 14/747,382, filed on Jun. 23, 2015, now Pat. No. 9,564,423.

(51) Int. Cl.
  *G01R 33/09* (2006.01)
  *H01L 43/08* (2006.01)
  *H01L 43/02* (2006.01)
(58) Field of Classification Search
  USPC .......................................................... 257/99
  See application file for complete search history.

(56) References Cited

U.S. PATENT DOCUMENTS

| | | | | |
|---|---|---|---|---|
| 8,283,742 | B2* | 10/2012 | Motz | G01R 15/202 257/427 |
| 8,679,895 | B2* | 3/2014 | Motz | G01R 15/202 216/22 |
| 8,680,843 | B2* | 3/2014 | Ausserlechner | G01R 15/207 324/117 H |
| 8,795,889 | B2* | 8/2014 | Saka | C01B 25/45 429/218.1 |
| 8,963,536 | B2* | 2/2015 | Ausserlechner | G01R 33/072 324/117 R |
| 9,024,630 | B2* | 5/2015 | Koop | H05K 1/18 29/832 |
| 9,476,915 | B2* | 10/2016 | Ausserlechner | G01R 15/202 |
| 9,564,423 | B2* | 2/2017 | Chen | H01L 25/16 |
| 9,564,578 | B2* | 2/2017 | Meyer | H01L 43/02 |
| 9,678,173 | B2* | 6/2017 | Castro Serrato | G01R 33/07 |
| 9,714,959 | B2* | 7/2017 | Kawanami | G01R 15/20 |
| 2004/0217451 | A1* | 11/2004 | Lee | H01L 23/055 257/666 |
| 2010/0295138 | A1* | 11/2010 | Montanya Silvestre | B81C 1/00246 257/415 |
| 2012/0038352 | A1* | 2/2012 | Elian | G01R 33/072 324/239 |
| 2012/0146165 | A1* | 6/2012 | Ausserlechner | G01R 15/202 257/421 |
| 2013/0264721 | A1 | 10/2013 | Landau et al. | |
| 2014/0327436 | A1* | 11/2014 | Castro Serrato | G01R 33/07 324/252 |

FOREIGN PATENT DOCUMENTS

| | | |
|---|---|---|
| DE | 102013113186 A1 | 6/2014 |
| DE | 102014106133 A1 | 11/2014 |

\* cited by examiner

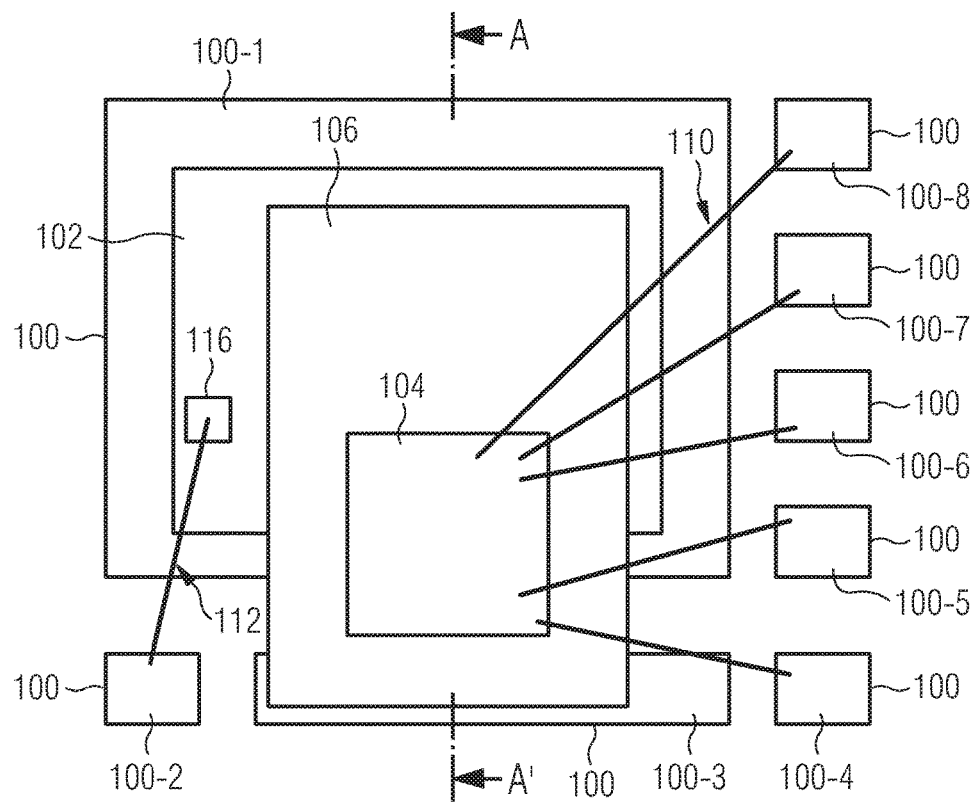

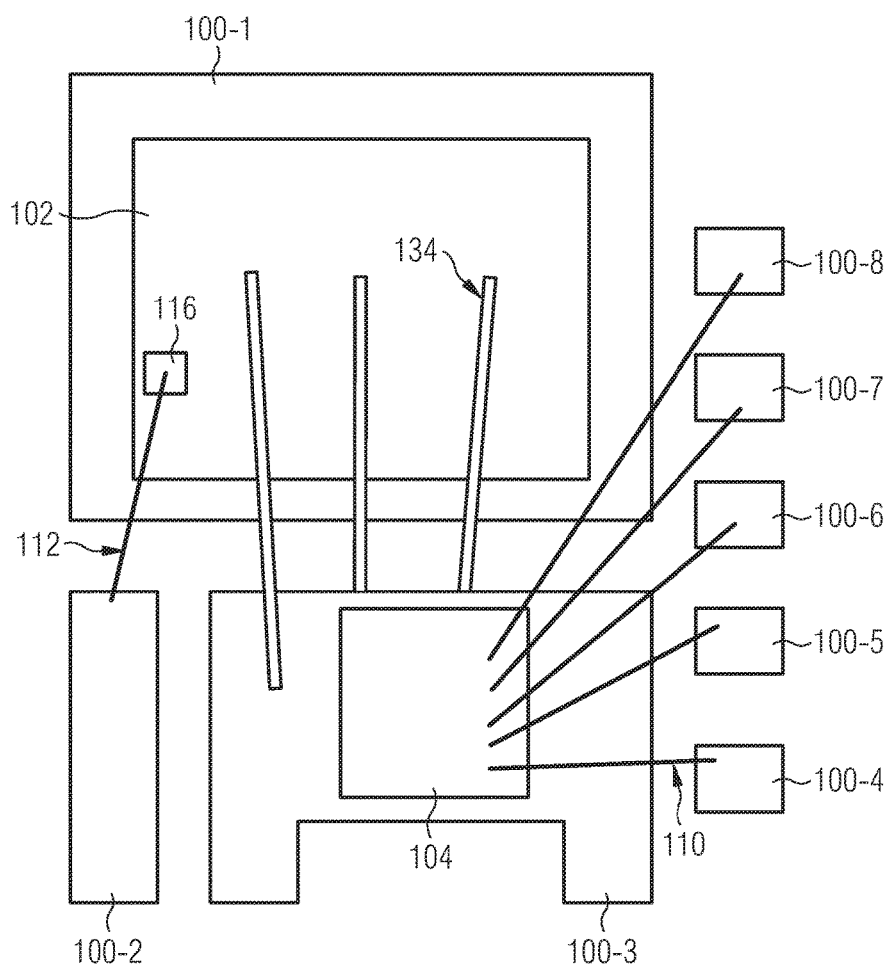

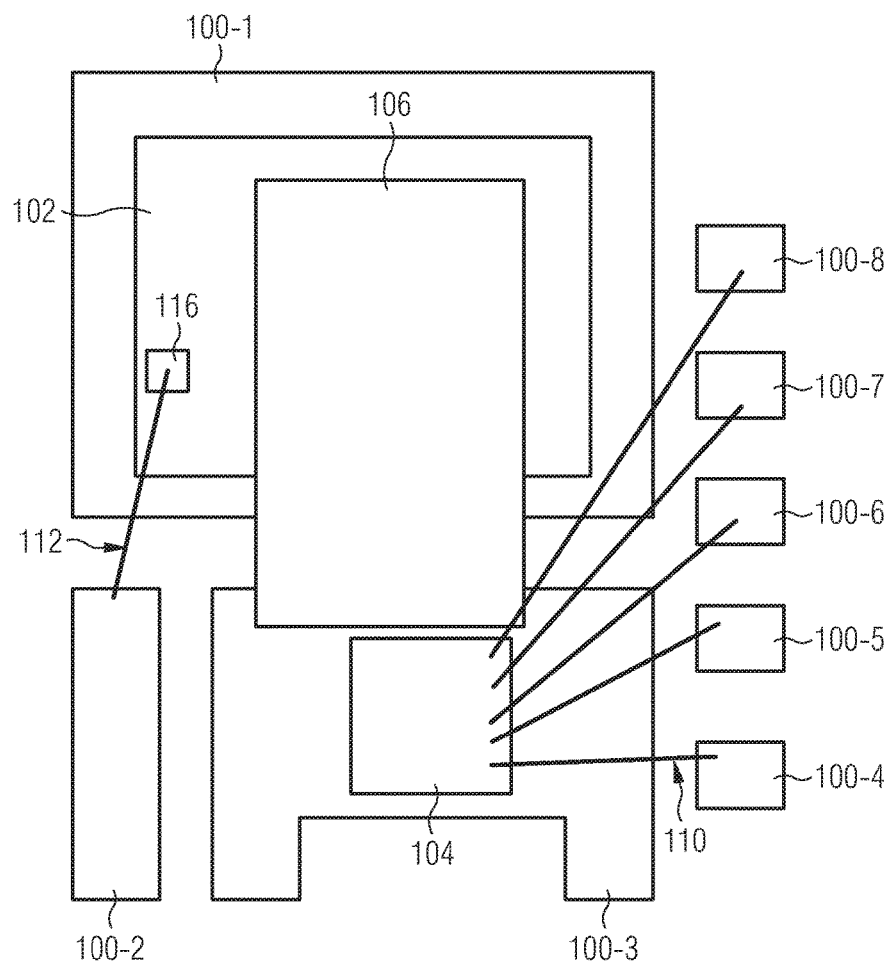

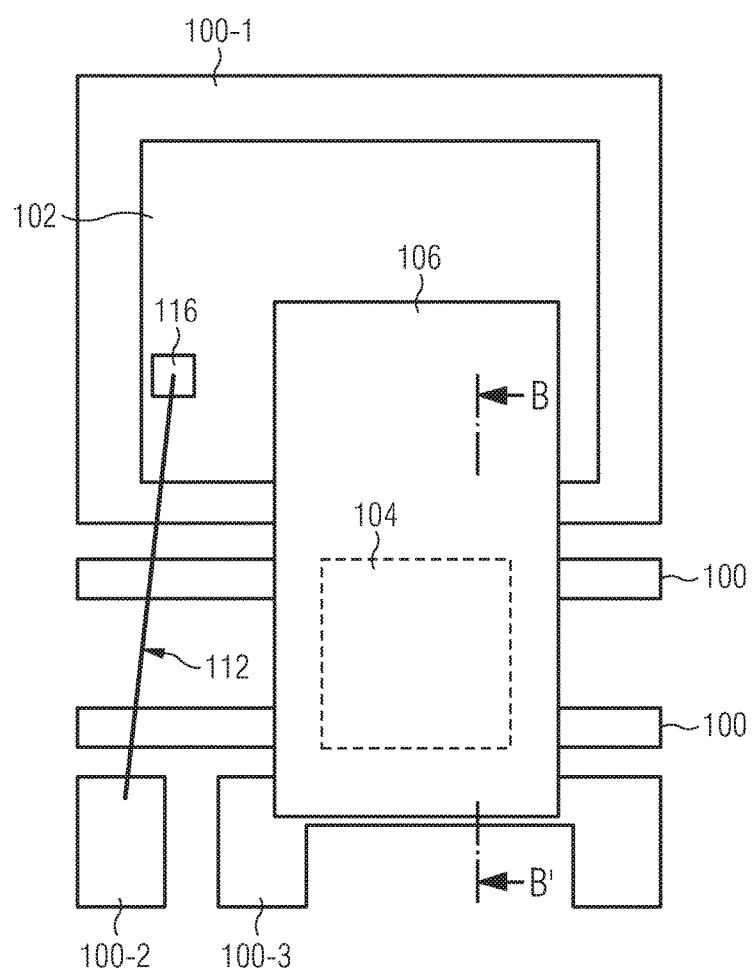

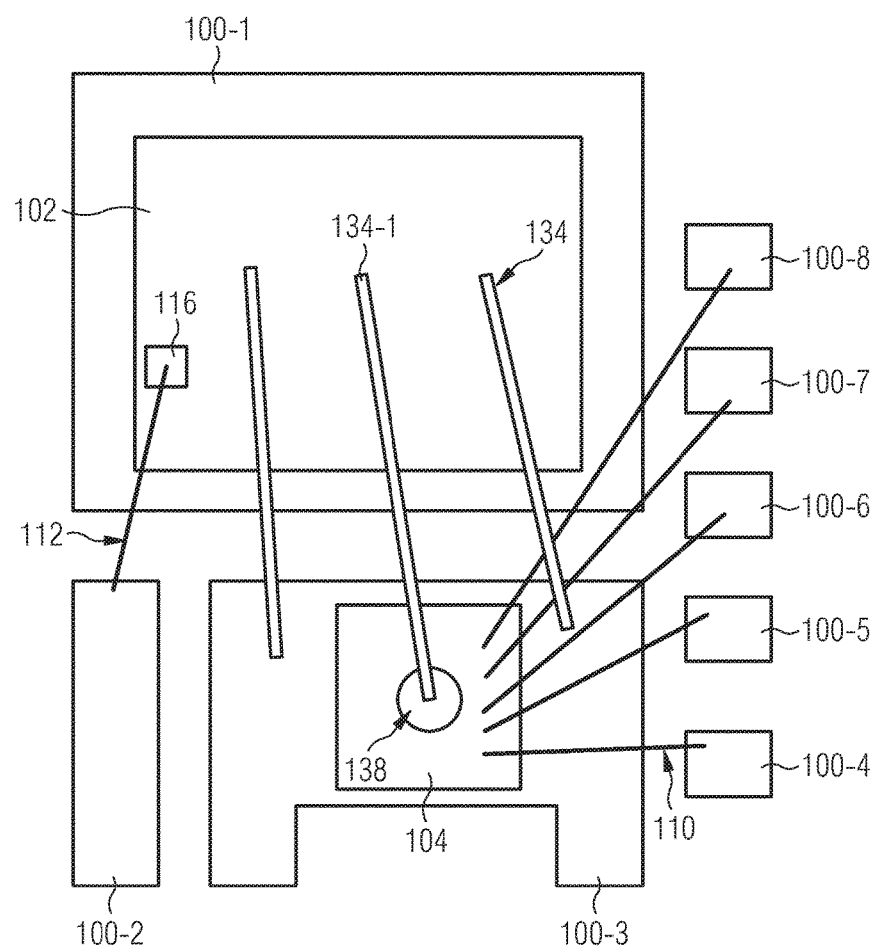

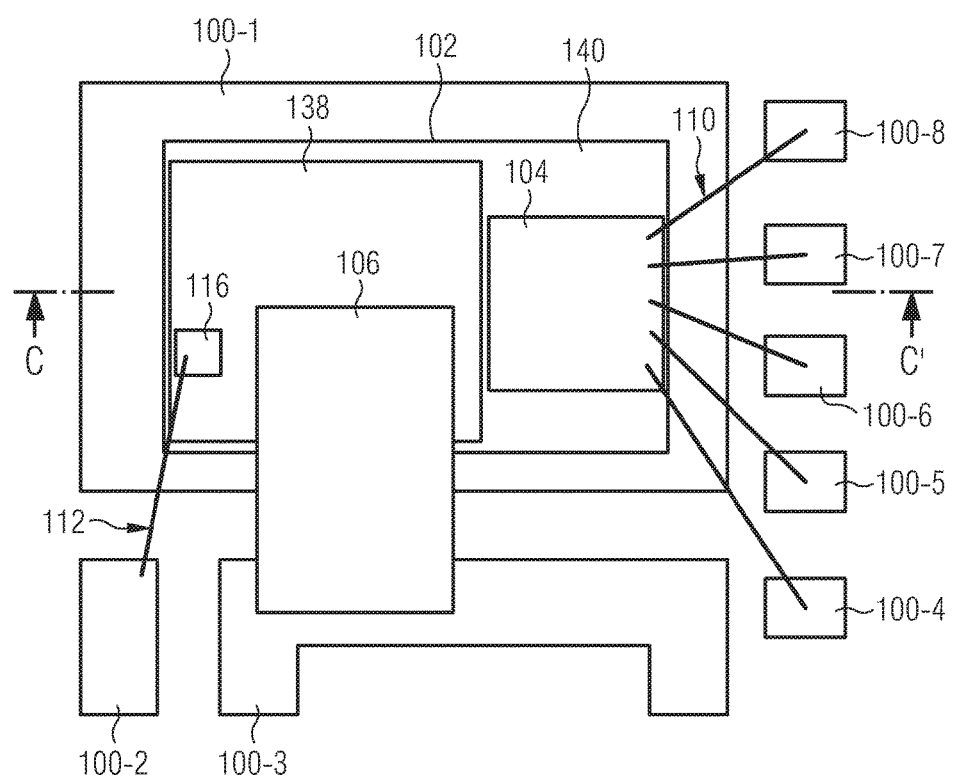

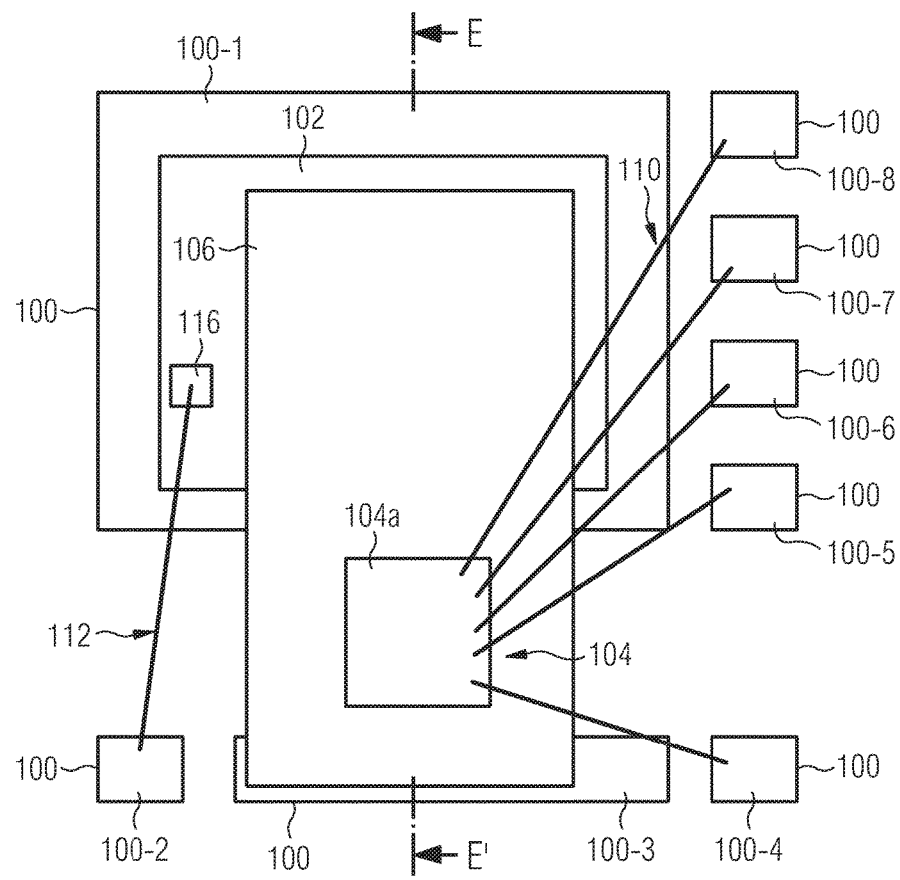

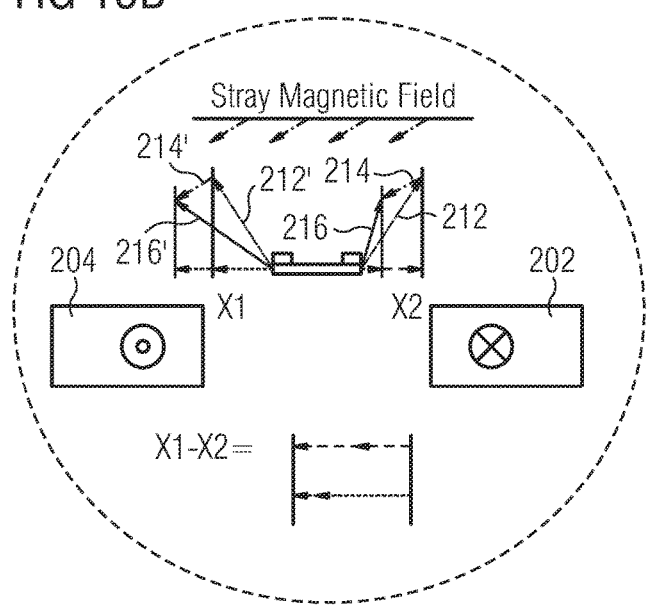

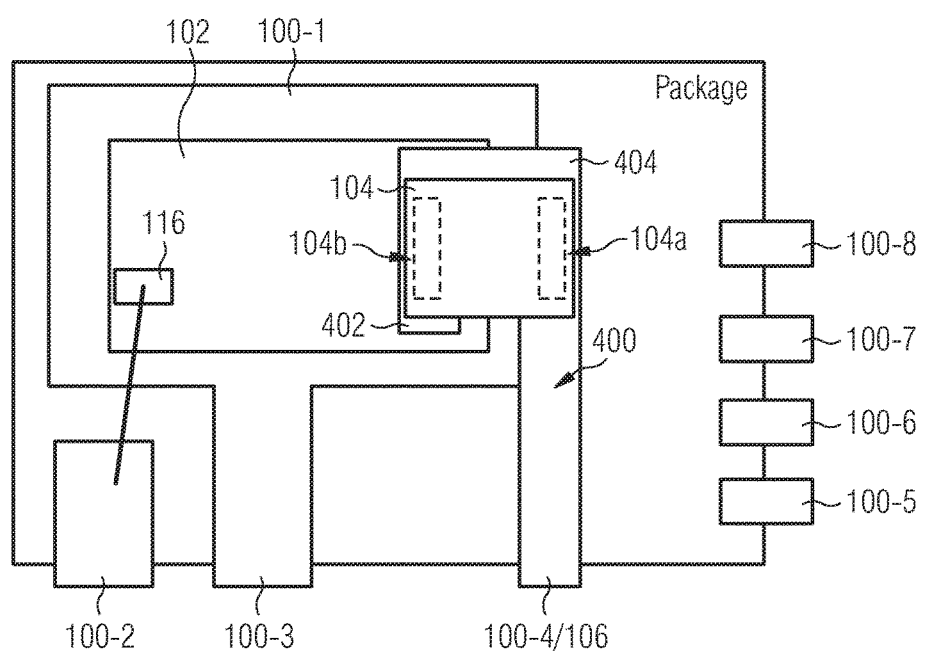

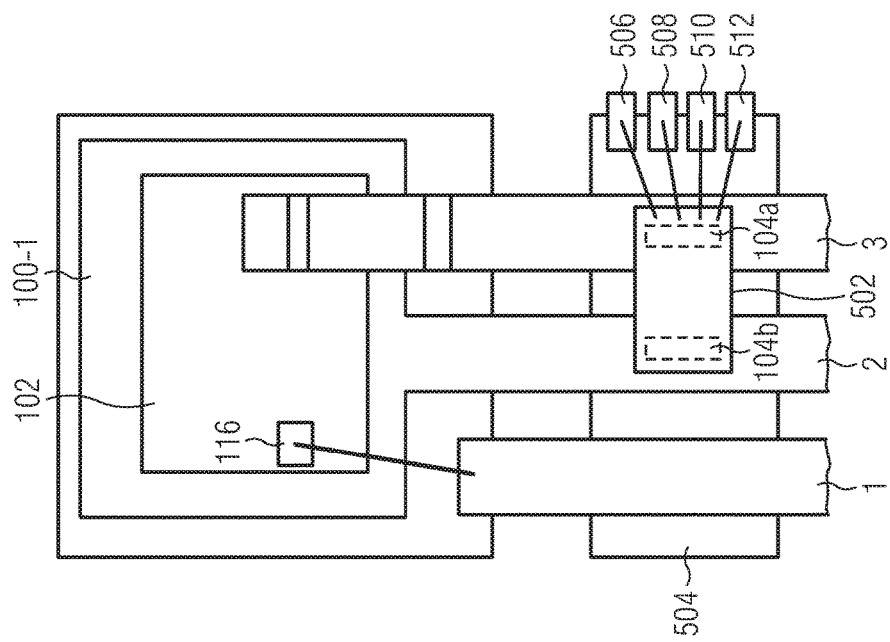
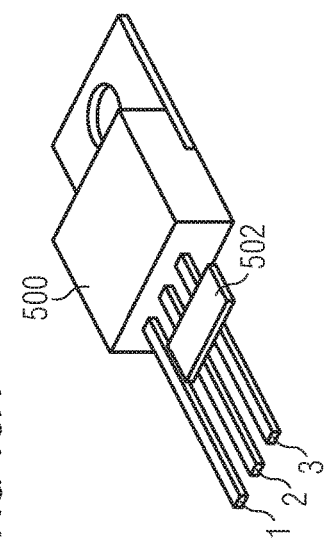

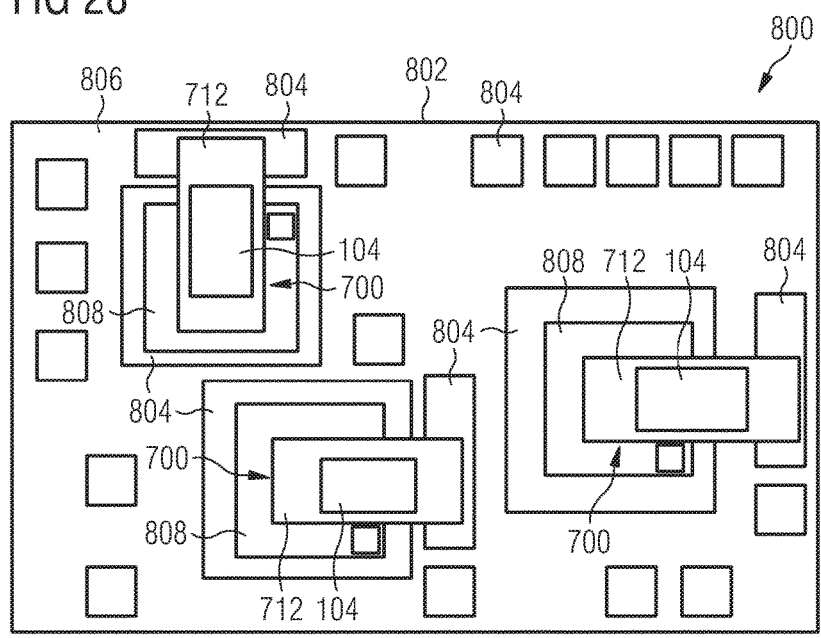

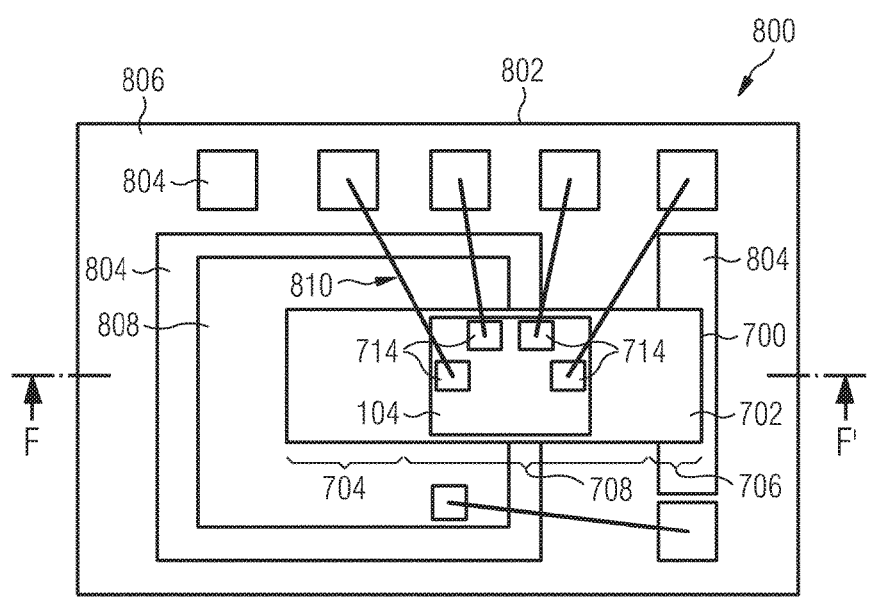

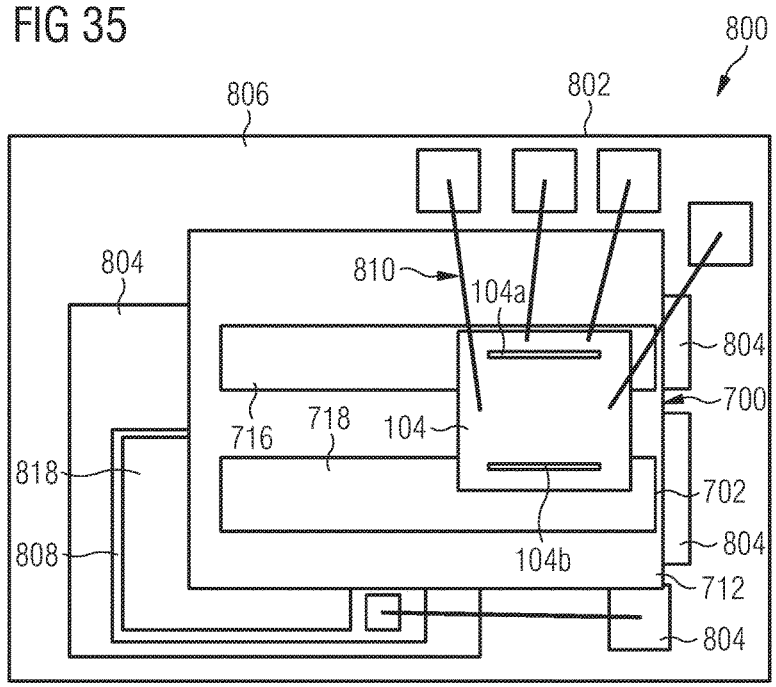

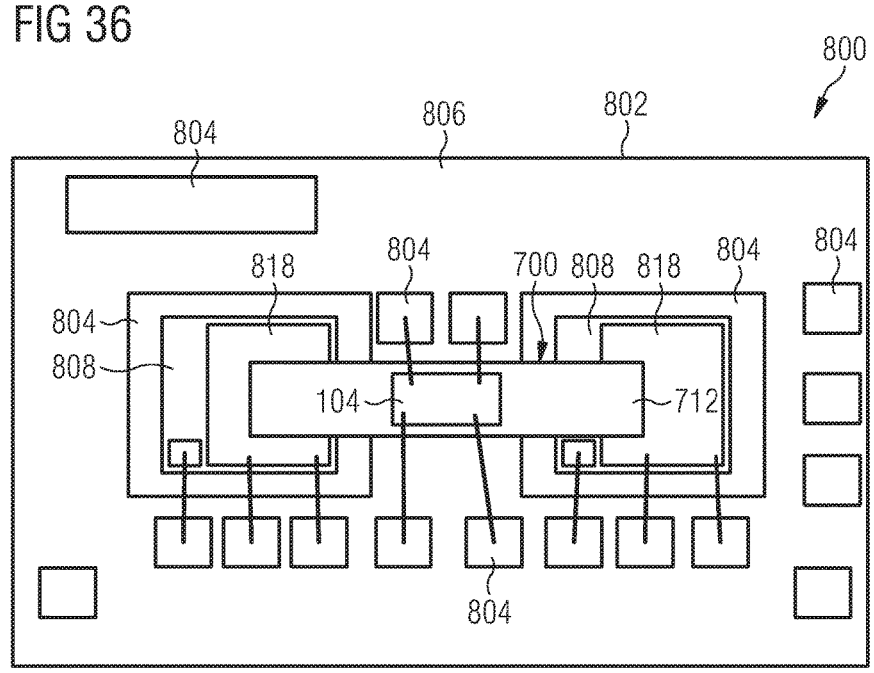

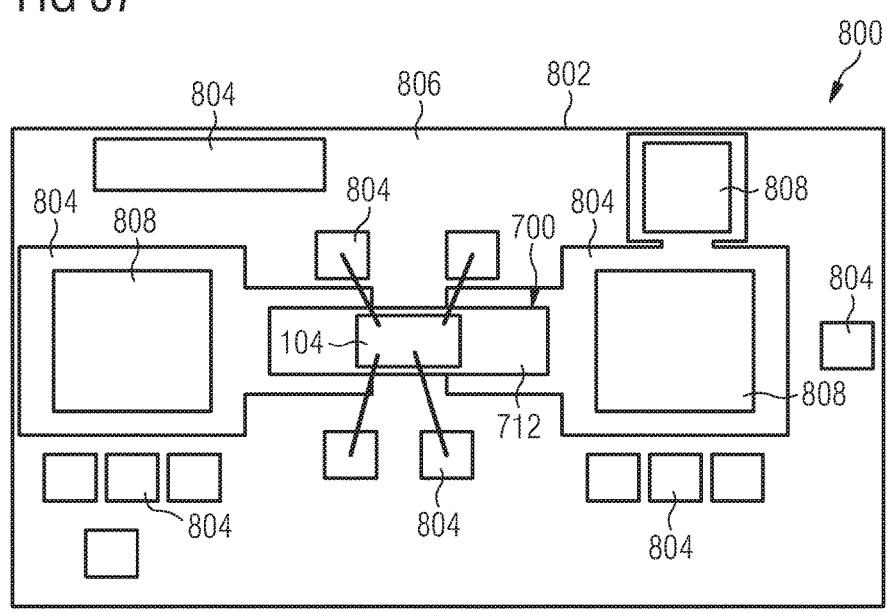

MULTI-FUNCTIONAL INTERCONNECT MODULE AND CARRIER WITH MULTI-FUNCTIONAL INTERCONNECT MODULE ATTACHED THERETO

TECHNICAL FIELD

The present application relates to multi-functional interconnect modules for mounting to carriers, in particular multi-functional interconnect modules with integrated magnetic field sensors.

BACKGROUND

Power packages include one or more power semiconductor dies such as power transistor and/or power diode dies attached to a substrate such as a lead frame or ceramic substrate having a patterned metallized surface. In each case, accurate current and/or temperature measurements are needed to ensure reliable and safe operation of the power package. Some current/temperature sensors are implemented using external components such as resistive shunts which are highly precise, but and complicate the package design. Other conventional approaches integrate an electrical-type sensor in the power semiconductor die. This approach reduces the complexity of the package design, but at the expense of reduced precision. Typical integrated electrical-type sensors such as a diode whose voltage is representative of temperature or current have poor sense accuracy e.g. +/−28%. The sense accuracy can be improved e.g. to +/−2% with customer calibration, but this requires calibration effort which increases cost. Some applications run with a defined safety margin or shut down feature in order to avoid over-current/heat and damage of the power semiconductor devices. The same issues apply to carriers such as circuit boards like PCBs (printed circuit boards), where sensing current and/or temperature of components attached to a circuit board can yield inaccurate results or require expensive solutions.

SUMMARY

According to an embodiment of an interconnect module, the interconnect module comprises a metal clip having a first end section, a second end section and a middle section extending between the first and the second end sections. The first end section is configured for external attachment to a bare semiconductor die or packaged semiconductor die attached to a carrier or to a metal region of the carrier. The second end section is configured for external attachment to a different metal region of the carrier or to a different semiconductor die or packaged semiconductor die attached to the carrier. The interconnect module further comprises a magnetic field sensor secured to the metal clip. The magnetic field sensor is operable to sense a magnetic field produced by current flowing through the metal clip.

According to an embodiment of a carrier assembly, the carrier assembly comprises a carrier having a plurality of metal regions embedded in or attached to an electrically insulating material, a first bare semiconductor die or packaged semiconductor die attached to a first one of the metal regions of the carrier, and a first interconnect module. The first interconnect module comprises a metal clip having a first end section, a second end section and a middle section extending between the first and the second end sections. The first end section is attached to the first metal region of the carrier or to the first bare semiconductor die or packaged semiconductor die. The second end section is attached to a second metal region of the carrier or to a second bare semiconductor die or packaged semiconductor die attached to the carrier. The first interconnect module further comprises a magnetic field sensor secured to the metal clip. The magnetic field sensor is operable to sense a magnetic field produced by current flowing through the metal clip.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1A illustrates a top down plan view of a first embodiment of a semiconductor package having an integrated magnetic field sensor.

FIG. 7 illustrates a top down plan view of a seventh embodiment of a semiconductor package having an integrated magnetic field sensor.

FIG. 8 illustrates a top down plan view of an eighth embodiment of a semiconductor package having an integrated magnetic field sensor.

FIG. 9A illustrates a top down plan view of a ninth embodiment of a semiconductor package having an integrated magnetic field sensor.

FIG. 10 illustrates a top down plan view of a tenth embodiment of a semiconductor package having an integrated magnetic field sensor.

FIG. 11A illustrates a top down plan view of an eleventh embodiment of a semiconductor package having an integrated magnetic field sensor.

FIG. 14A illustrates a top down plan view of a fourteenth embodiment of a semiconductor package having an integrated magnetic field sensor.

FIG. 15B illustrates a sectional view of the U-shaped metal clip shown in FIG. 15A along the line labelled A-A.

FIG. 17 illustrates a top down plan view of a sixteenth embodiment of a semiconductor package having an integrated magnetic field sensor.

FIG. 19A illustrates a perspective view of an eighteenth embodiment of a semiconductor package having an integrated magnetic field sensor.

FIG. 19B illustrates an enlarged sectional view of a region of the package shown in FIG. 19A.

FIG. 28 illustrates a top plan view of a first embodiment of a carrier assembly which uses the multi-functional interconnect module.

FIG. 29A illustrates a top plan view of a second embodiment of a carrier assembly which uses the version of the multi-functional interconnect module shown in FIG. 21.

FIG. 35 illustrates a top plan view of an eighth embodiment of a carrier assembly which uses the multi-functional interconnect module.

FIG. 36 illustrates a top plan view of a ninth embodiment of a carrier assembly which uses the multi-functional interconnect module.

FIG. 37 illustrates a top plan view of a tenth embodiment of a carrier assembly which uses the multi-functional interconnect module.

DETAILED DESCRIPTION

Embodiments described herein provide for the integration of a magnetic field sensor such as a magnetoresistive (XMR) sensor or a Hall sensor into a semiconductor package or stand-alone multi-functional interconnect module for integrated current and/or temperature measurement. The magnetic field sensor generates a signal in response to a magnetic field produced by current flowing in a current pathway of a semiconductor die included in the package or near the multi-functional interconnect module. The magnitude of the signal is proportional to the amount of current flowing in the current pathway, and indicates the current consumption of the semiconductor die and/or temperature of the package or multi-functional interconnect module. The semiconductor package or multi-functional interconnect module can be provided with or without galvanic isolation between the magnetic field sensor and the semiconductor die (in the case of a package) or metal clip (in the case of a multi-functional interconnect module).

The magnetic field sensor can be integrated into the same semiconductor package as the semiconductor die for which current and/or temperature measurements are desired, disposed outside the package on the current carrying connections of the package, or included in a stand-alone multi-functional interconnect module which is separate from the package. For example, the magnetic field sensor can be embedded in the semiconductor die, disposed on the semiconductor die, disposed on one or more of the package leads, disposed over or under a metal clip included in the semiconductor package for electrically connecting one or more of the leads to the semiconductor die or to another one of the leads, or disposed over or under a metal clip included in a multi-functional interconnect module which is separate from the die package.

In the case of a stand-alone multi-functional interconnect module, a bare die or packaged die can be attached to a carrier such as a circuit board (e.g. a PCB), a ceramic substrate, a plastic module, a molded module, a leadframe, etc. and the multi-functional interconnect module can be used to form an electrical connection between the die and a metal region of the carrier, between the die and another die attached to the carrier, or between two different metal regions of the carrier. In each case, the term 'on' as used herein indicates position in contact or in close proximity with and supported by an exterior surface, or to indicate a source of attachment or support.

Figure 1B:
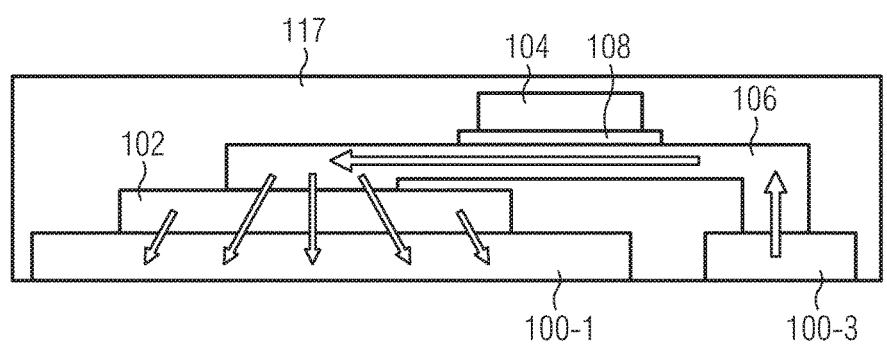
FIG. 1B illustrates a cross-sectional view of the package along the line labeled A-A' in FIG. 1A.

FIG. 1A illustrates a top down plan view of a first embodiment of a semiconductor package, and FIG. 1B illustrates a cross-sectional view of the package along the line labeled A-A' in FIG. 1A. Die attach material and chip metallizations are not shown in FIGS. 1A and 1B for ease of illustration.

The semiconductor package includes a substrate having a plurality of metal leads 100 and a semiconductor die 102 attached to a first one of the leads 100-1. The package can include a single semiconductor die or more than one semiconductor die. Any standard semiconductor package substrate can be used. For example, the substrate can be a lead frame having a die paddle lead 100-1 to which the semiconductor die 102 is attached and a plurality of signal and power leads 100-2 through 100-8 for providing signal and power connections to the semiconductor die 102. In another example, the substrate can be a ceramic-based substrate such as a DCB (direct copper bonded) substrate, AMB (active metal brazed) substrate, or DAB (direct aluminum bonded) substrate in which one or both main sides of a ceramic base have a patterned metallized surface which form the leads 100 for attaching the semiconductor die 102 and providing signal and power connections to the semiconductor die 102. In other examples, the substrate can be a patterned metal substrate, a printed circuit board (PCB), etc. The semiconductor package can be any type of standard semiconductor package having leads 100 for attaching the semiconductor die 102 and providing signal and power connections to the semiconductor die 102. For example, the semiconductor package can be a molded package, an open cavity package with or without a lid, an encapsulated polymer package, a PCB-based package, etc. In each case, the term 'lead' as used herein refers to any insulated electrical conductor physically or electrically connected to an electrical device.

A magnetic field sensor 104 is integrated in the same package as the semiconductor die 102, and positioned in close proximity to a current pathway of the semiconductor die 102 so that the sensor 104 can sense a magnetic field produced by current flowing in the current pathway. According to the embodiment illustrated in FIGS. 1A and 1B, the magnetic field sensor 104 is disposed over a metal clip 106 included in the semiconductor package. The metal clip 106 electrically connects one or more of the leads 100 to the semiconductor die 102. In one case, the metal clip 106 is made of copper. However, the metal clip 106 can be made of other materials. In each case, the magnetic field sensor 104 generates a signal in response to a magnetic field produced by current flowing in a current pathway of the semiconductor die 102. The current pathway is illustrated by arrows in FIG. 1B.

The magnitude of the signal generated by the magnetic field sensor 104 is proportional to the amount of current flowing in the current pathway, and indicates the current consumption of the semiconductor die 102 and/or the temperature of the package. For example in the case of a Hall sensor, a transducer included in the magnetic field sensor 104 varies its output voltage in response to the magnetic field. In the case of a magnetoresistive (XMR) sensor such as an anisotropic magnetoresistive (AMR) sensor, giant magnetoresistive (GMR) sensor or tunnel magnetoresistive (TMR) sensor, the electric resistivity of a metal, semi-metal or semiconductor included in the magnetic field sensor 104 changes under the influence of the magnetic field. The orientation and configuration of the magnetic field sensor 104 can vary according the type of sensor device employed. In each case, the magnitude of the signal generated by the magnetic field sensor 104 is a monotonically dependent response to the amount of current flowing in the current pathway of the semiconductor die 102. As such, current flow through the semiconductor die 102 and temperature within the package can be measured simultaneously.

For example in the case of a power MOSFET die, current flow through the source or drain of the power MOSFET can be measured accurately by positioning the magnetic field sensor 104 in close proximity to the source or drain current pathway of the device. In the case of an IGBT die, current flow through the emitter or collector of the IGBT can be measured accurately by positioning the magnetic field sensor 104 in close proximity to the emitter or collector current pathway of the device. In the case of a power diode die, current flow through the anode or cathode of the power diode can be measured accurately by positioning the magnetic field sensor 104 in close proximity to the anode or cathode current pathway of the device. Even if the signal generated by the magnetic field sensor 104 is nonlinear, it can be corrected e.g. with a microcontroller.

In some applications, the magnetic field sensor 104 may be powered or carry signals at a significantly lower voltage (e.g. 5V) as compared to the semiconductor die 102 (e.g. 500V, 1000V or even higher). For these applications, the magnetic field sensor 104 can be galvanically isolated from the metal clip 106 and therefore from the semiconductor die 102. In one embodiment, the magnetic field sensor 104 is spaced apart from the metal clip 106 by a spacer 108. The spacer 108 can be electrically conductive or electrically insulating. For example, the spacer 108 can be a conductive adhesive, sinter material, solder, etc. for applications in the low to medium voltage range (e.g. up to 500V). In another example, the material of the spacer 108 can be chosen so as to provide galvanic isolation. A conductive adhesive can be used as the spacer 108 in the case the clip voltage and microcontroller has no voltage difference, or the voltage spikes on the clip 106 are blocked by other components. Otherwise, the spacer 108 provides galvanic isolation e.g. with nonconductive glue. The thickness of the glue influences the response of the magnetic field sensor 104 and the galvanic isolation level. The spacer material and dimensions can be selected to optimize minimal detected current, maximal detected current and galvanic isolation level.

The thickness of the spacer 108 can be chosen so that the strength of the magnetic field which enters the magnetic field sensor 104 is reduced to a non-destructive level. A relatively thick spacer is particularly advantageous for high current applications. In one embodiment, the spacer 108 is a semiconductor die such as a silicon die interposed between the magnetic field sensor 104 and the metal clip 106. In other embodiments, the spacer 108 can be a polymer, ceramic, non-conductive adhesive, non-conductive film, or any other single or multi-layer material which separates the magnetic field sensor 104 from the metal clip 106. Alternatively, the magnetic field sensor 104 can be directly attached to the metal clip 106 e.g. by solder if the sensor 104 has a solderable backside or by a non-electrically conductive adhesive.

Electrical connections can be made to the magnetic field sensor by electrical conductors 110 such as wire bonds, wire ribbons, etc. which are attached at one end to the magnetic field sensor 104 and at the opposing end to one or more of the package leads 100. An additional electrical conductor 112 electrically connects a separate pad 114 on the topside of the semiconductor die 102 to a corresponding package lead 100-2 e.g. to form a gate connection for a transistor die. The metal clip 106 can provide the drain (MOSFET) or collector (IGBT) connection in the case of a power transistor, or the anode or cathode connection in the case of a power diode. An electrical connection to the backside of the semiconductor die 102 is provided by the package lead 100-1 attached to this side of the die 102. This electrical connection can be the source (MOSFET) or emitter (IGBT) connection in the case of a power transistor, or the cathode or anode connection in the case of a power diode.

The semiconductor package can be molded or encapsulated with a non-conductive material 117 such as a mold compound, adhesive, silicone, silicone gel, etc. The non-conductive material 117 is not shown in FIG. 1A for ease of illustration. In addition to the reliability provided by such a mold/encapsulant 117, the dielectric properties of the mold/encapsulant 117 also ensure good electrical insulation between the sensor 104 which operates at a relatively low voltage (e.g. 5V) and the semiconductor die 102 which operates at a relatively high voltage (e.g. several hundred or thousands of volts).

Figure 2:
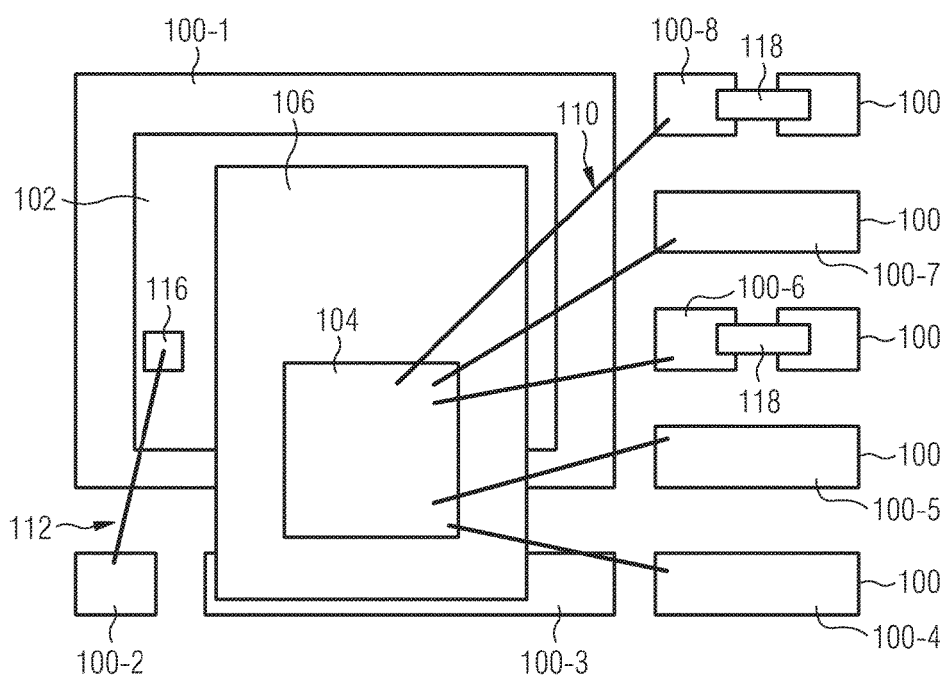
FIG. 2 illustrates a top down plan view of a second embodiment of a semiconductor package having an integrated magnetic field sensor.

FIG. 2 illustrates a top down plan view of a second embodiment of the semiconductor package. The embodiment shown in FIG. 2 is similar to the embodiment shown in FIGS. 1A and 1B. Different, however, passive components 118 such as resistors and/or capacitors which comprise part of the sensing circuit that includes the magnetic field sensor 104 are also integrated in the same package as the sensor 104 and the semiconductor die 102. The passive components 118 are attached to different ones of the package leads 100. Electrical conductors 110 such as wire bonds, wire ribbons, etc. electrically connect the passive components 118 to the magnetic field sensor 104.

Figure 3:
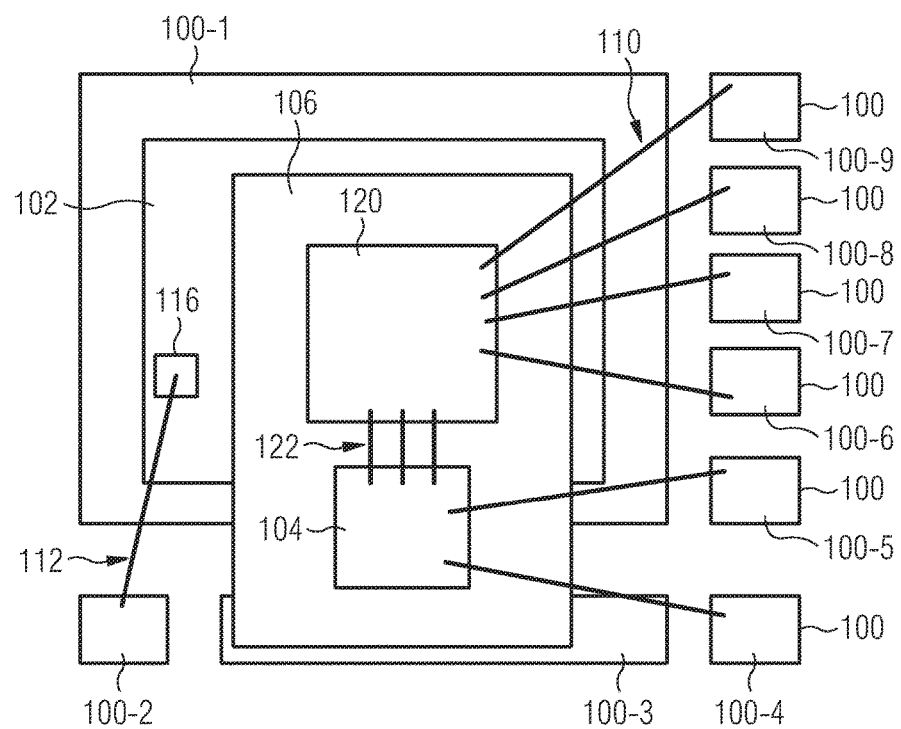
FIG. 3 illustrates a top down plan view of a third embodiment of a semiconductor package having an integrated magnetic field sensor.

FIG. 3 illustrates a top down plan view of a third embodiment of the semiconductor package. The embodiment shown in FIG. 3 is similar to the embodiment shown in FIGS. 1A and 1B. Different, however, a logic device 120 for controlling the magnetic field sensor 104 is attached to the same metal clip 106 on which the sensor 104 is disposed. Any standard logic device such as a microcontroller, ASIC (application-specific integrated circuit), etc. capable of controlling operation of the magnetic field sensor 104 can be used. Electrical conductors 110 such as wire bonds, wire ribbons, etc. electrically connect the logic device 120 to one or more leads of the package to provide electrical connections to the logic device. Additional electrical conductors 122 such as wire bonds, wire ribbons, etc. electrically connect the logic device 120 to the magnetic field sensor 104.

Figure 4:
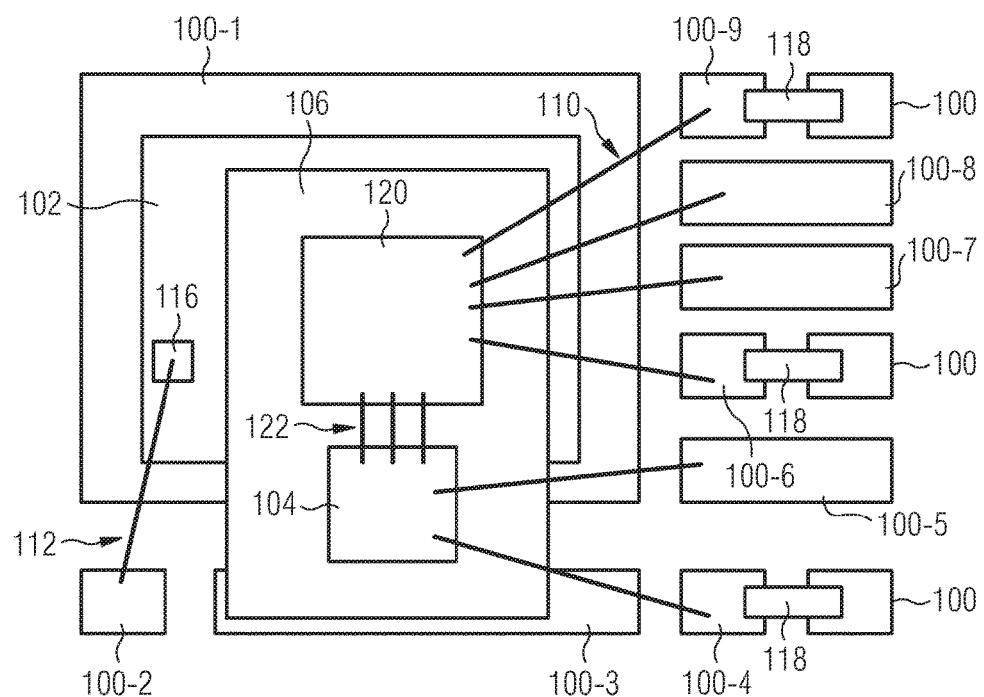
FIG. 4 illustrates a top down plan view of a fourth embodiment of a semiconductor package having an integrated magnetic field sensor.

FIG. 4 illustrates a top down plan view of a fourth embodiment of the semiconductor package. The embodiment shown in FIG. 4 is similar to the embodiment shown in FIG. 3. Different, however, passive components 118 such as resistors and/or capacitors which comprise part of the sensing circuit that includes the logic device 120 and the magnetic field sensor 104 are also integrated in the same package as the sensor 104, logic device 120 and semiconductor die 102. The passive components 118 are attached to different ones of the package leads 100. Electrical conductors 110 such as wire bonds, wire ribbons, etc. electrically connect the passive components 118 to the logic device 120 and/or the magnetic field sensor 104. As such, the passive components 118 are electrically connected to the magnetic field sensor 104 and the logic device 120 to form the desired sensing circuit.

Figure 5:
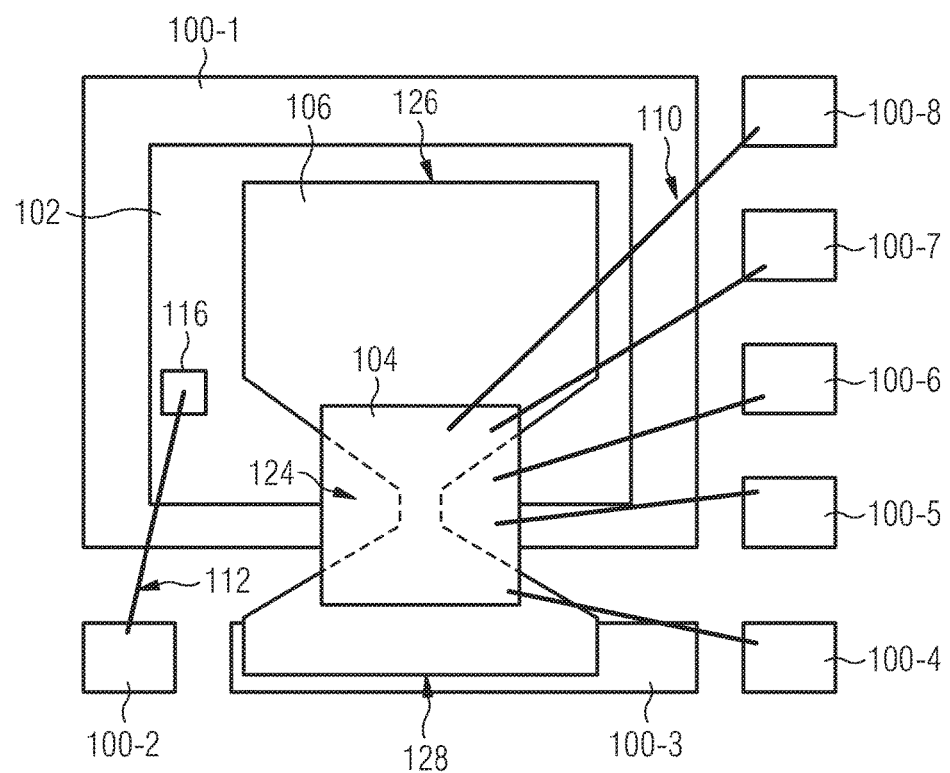
FIG. 5 illustrates a top down plan view of a fifth embodiment of a semiconductor package having an integrated magnetic field sensor.

FIG. 5 illustrates a top down plan view of a fifth embodiment of the semiconductor package. The embodiment shown in FIG. 5 is similar to the embodiment shown in FIGS. 1A and 1B. Different, however, the metal clip 106 has a tapered region 124 for which the width of the metal clip 106 reduces to less or equal than the width of the magnetic field sensor 104 and the sensor 104 is positioned over the tapered region 124. The tapered region 124 is interposed between wider opposing end regions 126, 128 of the metal clip 106. The portion of the tapered region 124 disposed under the magnetic field sensor 104 and having a narrower width than the sensor 104 is shown in dashed lines in FIG. 5 since this section of the tapered region 124 is covered by the magnetic field sensor 104 and therefore out of view.

Figure 6:
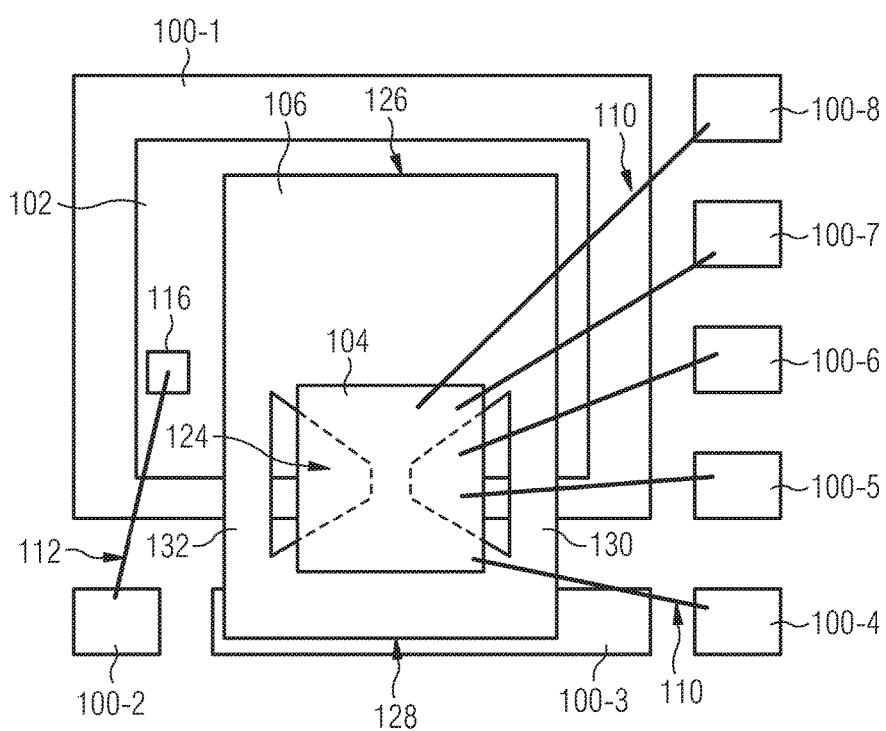
FIG. 6 illustrates a top down plan view of a sixth embodiment of a semiconductor package having an integrated magnetic field sensor.

FIG. 6 illustrates a top down plan view of a sixth embodiment of the semiconductor package. The embodiment shown in FIG. 6 is similar to the embodiment shown in FIG. 5. Different, however, the metal clip 106 further includes lateral branches 130, 132 which extend in parallel with the tapered region 124 between the opposing end regions 126, 128. The lateral branches 130, 132 are spaced apart from the tapered region 124 and uncovered by the magnetic field sensor 104. The addition of the lateral branches 130, 132 allows the metal clip 106 to handle more current than the clip configuration illustrated in FIG. 5. However, additional calibration effort and offset values may be needed since the entire current pathway does not run under the magnetic field sensor 104. As such, the magnetic field sensed by the magnetic field sensor 104 does not represent the total current flowing though the pathway but instead only the portion of the current flowing under the sensor 104.

FIG. 7 illustrates a top down plan view of a seventh embodiment of the semiconductor package. The embodiment shown in FIG. 7 is similar to the embodiment shown in FIGS. 1A and 1B. Different, however, the magnetic field sensor 104 is disposed on a package lead 100-3 different than the lead 100-1 to which the semiconductor die 102 is attached. The lead 100-3 on which the magnetic field sensor 104 is disposed provides an electrical connection to the semiconductor die 102 through one or more electrical conductors 134 such as wire bonds, wire ribbons, etc. One or more of these electrical conductor(s) 134 are interposed between the semiconductor die 102 and the magnetic field sensor 104. The magnetic field sensor 104 is operable to sense the magnetic field produced by current flowing in the current pathway realized by the lead 100-3 on which the magnetic field sensor 104 is disposed and each electrical conductor 134 connected to this lead 100-3 and interposed between the semiconductor die 102 and the magnetic field sensor 104.

FIG. 8 illustrates a top down plan view of an eighth embodiment of the semiconductor package. The embodiment shown in FIG. 8 is similar to the embodiment shown in FIG. 7. Different, however, the electrical connection between the lead 100-3 on which the magnetic field sensor 104 is disposed and the semiconductor die 102 is provided by a metal clip 106 instead of wire bonds or ribbons. The magnetic field sensor 104 is operable to sense the magnetic field produced by current flowing in the current pathway realized by the lead 100-3 on which the magnetic field sensor 104 is disposed and the metal clip 106 which electrically connects this lead 100-3 to the semiconductor die 102.

Figure 9B:
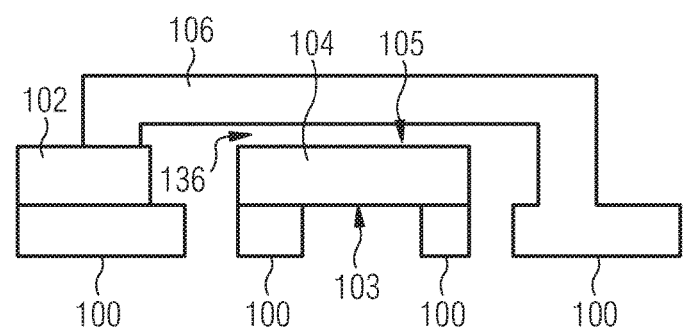
FIG. 9B illustrates a cross-sectional view of the package along the line labeled B-B' in FIG. 9A.

FIG. 9A illustrates a top down plan view of a ninth embodiment of the semiconductor package, and FIG. 9B illustrates a cross-sectional view of the package along the line labeled B-B' in FIG. 9A. The embodiment shown in FIGS. 9A and 9B is similar to the embodiment shown in FIGS. 1A and 1B. Different, however, the magnetic field sensor 104 is disposed under a metal clip 106 which electrically connects one of the package leads 100-3 to the semiconductor die 102. The magnetic field sensor 104 is shown as a dashed box in FIG. 9A because the sensor 104 is covered by the metal clip 106 in this view. One or more of the package leads 100 extend under the metal clip 106 to provide electrical connections at the backside 103 of the magnetic field sensor 104. Mechanical contact between the topside 105 of the magnetic field sensor 104 and the overlying metal clip 106 is not necessary, because the sensor 104 is supported by one or more of the underlying package lead(s) 110. The topside 105 of the magnetic field sensor 104 can be galvanically isolated from the overlying metal clip 106 by e.g. an air gap 136. In addition or alternatively, a spacer (not shown in FIG. 9B) can separate the magnetic field sensor 104 from the metal clip 106 e.g. as shown in FIG. 1B. For example, the gap 136 can be filled with some kind of polymer such as mold compound, non-conductive adhesive or non-conductive film/tape. Alternatively, a conductive material can fill the gap 136 between the sensor 104 and the overlying metal clip 106 in the case of low voltage devices. Different than FIG. 1B, the spacer would be interposed between the topside 105 of the magnetic field sensor 104 and the overlying metal clip 106.

FIG. 10 illustrates a top down plan view of a tenth embodiment of the semiconductor package. The embodiment shown in FIG. 10 is similar to the embodiment shown in FIG. 7. Different, however, the magnetic field sensor 104 has an opening 138 extending through the sensor 104. Various semiconductor technologies readily enable the formation of such an opening 138 e.g. by masking and chemical etching processes, laser drilling processes, etc., and therefore no further explanation is provided in this regard. At least one electrical conductor 134-1 is attached to the lead 100-3 on which the magnetic field sensor 104 is disposed, through the opening 138 in the sensor 104. The other end of this lead 134-1 is attached to the semiconductor die 102 to complete the corresponding electrical connection. The magnetic field sensor 104 is operable to sense the magnetic field produced by current flowing in the current pathway realized by the lead 100-3 on which the magnetic field sensor 104 is disposed and the electrical conductor 134-1 attached to this lead 100-3 through the opening 138 in the magnetic field sensor 104.

Figure 11B:
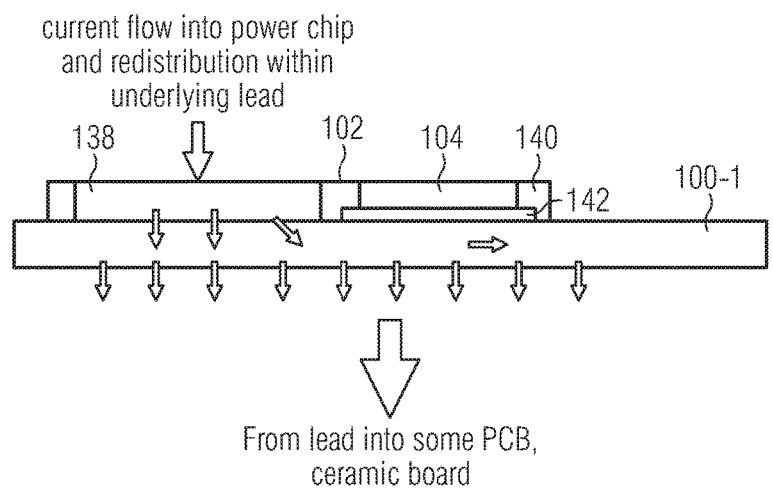
FIG. 11B illustrates a cross-sectional view of the package along the line labeled C-C' in FIG. 11A.

FIG. 11A illustrates a top down plan view of an eleventh embodiment of the semiconductor package, and FIG. 11B illustrates a cross-sectional view of the package along the line labeled C-C' in FIG. 11A. The embodiment shown in FIGS. 11A and 11B is similar to the embodiment shown in FIGS. 1A and 1B. Different, however, the magnetic field sensor 104 is embedded in the same die 102 as the power semiconductor device(s) 140. The die 102 includes a semiconductor body 140 comprising Si or a compound semiconductor such as SiC, GaAs, GaN, etc. The power device(s) 138 are formed in the semiconductor body 140. The magnetic field sensor 104 is disposed in the same semiconductor body 140 as the power device(s) 138, but galvanically isolated from the power device(s) 138. The galvanic isolation 142 can be integrated in the semiconductor body 140, or as part of a bondline with the underlying package lead 100-1. In each case, the current flow pathway into the power device(s) 138 and out of the power device(s) 138 to some PCB, ceramic substrate, etc. (not shown) is illustrated in FIG. 11B by a series of arrows. As shown in FIG. 11B, some of the current spreads out under the magnetic field sensor 104 in the lead 100-1 to which the die 102 is attached. The magnetic field produced by the current flowing in this part of the lead 100-1 is sensed by the integrated magnetic field sensor 104. The magnitude of the corresponding signal generated by the sensor 104 is proportional to the amount of current flowing in this part of the current pathway. The metal clip 106 shown in FIG. 11A can be replaced by a different type of electrical conductor such as wire bonds, wire ribbons, etc.

Figure 12:
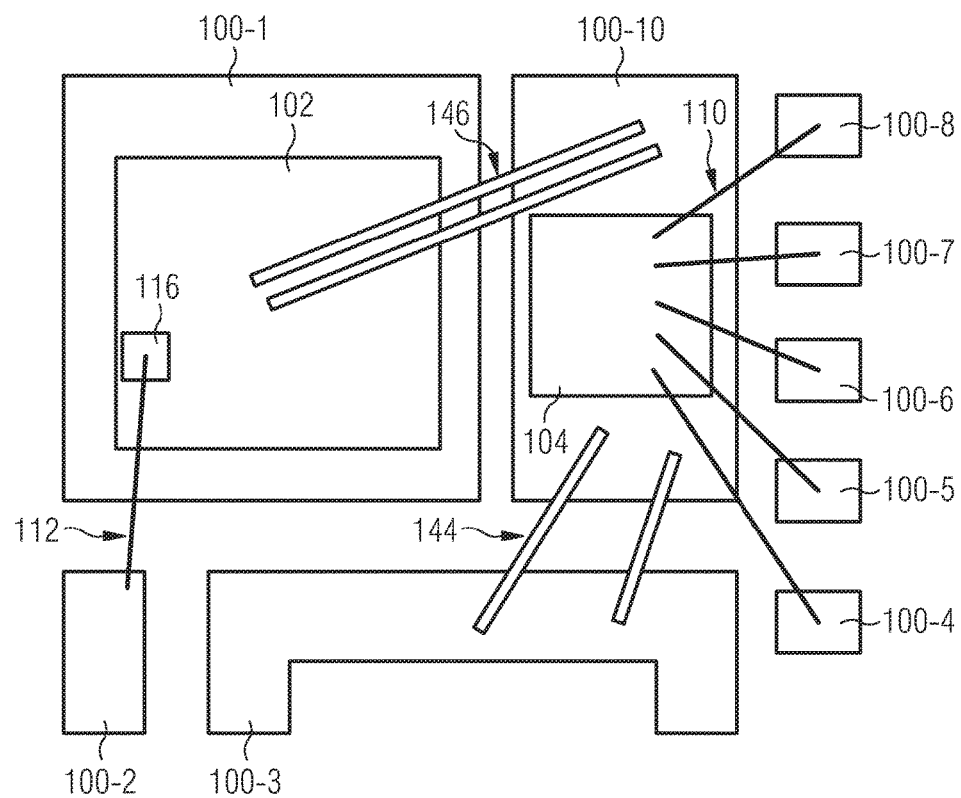
FIG. 12 illustrates a top down plan view of a twelfth embodiment of a semiconductor package having an integrated magnetic field sensor.

FIG. 12 illustrates a top down plan view of a twelfth embodiment of the semiconductor package. The embodiment shown in FIG. 12 is similar to the embodiment shown in FIG. 7. Different, however, the magnetic field sensor 104 is disposed on a third lead 100-10. A first set 144 of one or more electrical conductors such as wire bonds, wire ribbons, etc. each have a first end attached to a second lead 100-3 and a second end attached to the third lead 100-10. A second set 146 of one or more electrical conductors such as wire bonds, wire ribbons, etc. each have a first end attached to the third lead 100-10 and a second end attached to the semiconductor die 102 which is attached to a first lead 100-1. The magnetic field sensor 104 is interposed between the first set 144 and the second set 146 of one or more electrical conductors, and senses the magnetic field produced by the current flowing from the first set 144 of one or more electrical conductors to the second set 146 of one or more electrical conductors through the third lead 100-10.

Figure 13A:
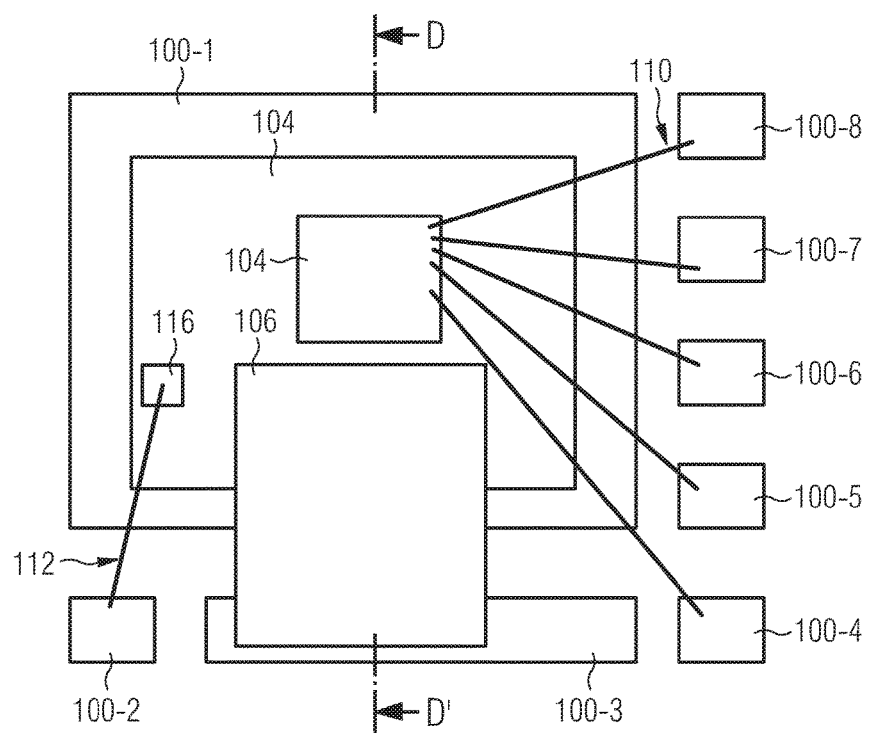
FIG. 13A illustrates a top down plan view of a thirteenth embodiment of a semiconductor package having an integrated magnetic field sensor.
Figure 13B:
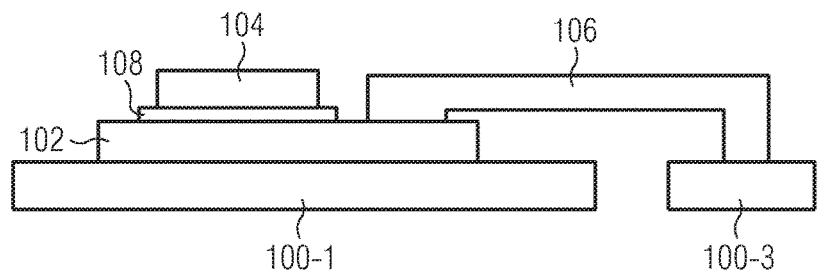
FIG. 13B illustrates a cross-sectional view of the package along the line labeled D-D' in FIG. 13A.

FIG. 13A illustrates a top down plan view of a thirteenth embodiment of the semiconductor package, and FIG. 13B illustrates a cross-sectional view of the package along the line labeled D-D' in FIG. 13A. The embodiment shown in FIGS. 13A and 13B is similar to the embodiment shown in FIGS. 1A and 1B. Different, however, the magnetic field sensor 104 is disposed on the semiconductor die 102 instead of the metal clip 106 which electrically connects the corresponding package lead 100-3 to the semiconductor die 102. The magnetic field sensor 104 is galvanically isolated from the semiconductor die 102. In one embodiment, a spacer 108 separates the magnetic field sensor 104 from the semiconductor die 102. The spacer 108 can provide both galvanic isolation and magnetic field reduction at the sensor 104 as previously described herein.

The embodiments described above position the magnetic field sensor such that the magnetic field strength of interest is measured in only one direction. With such a sensor configuration, additional signal processing must be performed to suppress the influence of stray magnetic fields such as the earth's magnetic field on the measurement results. Accordingly, current measurement information derived from the sensor output can include contributions attributable to stray magnetic fields which impinge on the magnetic field sensor, making the current measurement information less accurate if not further processed to cancel out these contributions. The embodiments described below use a differential measuring method where the magnetic field sensor comprises at least two magnetic field sensor components positioned so that the magnetic field of interest impinges on the magnetic field sensor components in different directions, allowing to more easily suppress the influence of stray magnetic fields such as the earth's field on the measurement results.

The magnitude of the signal generated by each magnetic field sensor component is proportional to the amount of current flowing in the current pathway, and indicates the current consumption of the semiconductor die and/or the temperature of the package. For example in the case of a Hall sensor, at least two transducers can be positioned so that the magnetic field of interest (vertically) impinges on the transducers in different vertical directions. Each transducer varies its output voltage in response to the magnetic field. In the case of magnetoresistive (XMR) sensor components such as anisotropic magnetoresistive (AMR) sensor components, giant magnetoresistive (GMR) sensor components or tunnel magnetoresistive (TMR) sensor components, the electric resistivity of a metal, semi-metal or semiconductor included in the XMR sensor components changes under the influence of the magnetic field which impinges (laterally) on the XMR sensor components in different lateral directions.

The orientation and configuration of the magnetic field sensor components can vary according the type of magnetic field sensor employed. For example, the magnetic field sensor components can be one-dimensional XMR or Hall devices in that they measure just the magnetic field intensity or can be three-dimensional devices which also output an electrical signal which is proportional to the distance between the current pathway and the three-dimensional magnetic field sensing component. In each case, the magnitude of the signal generated by each magnetic field sensor component is proportional to the amount of current flowing in the current pathway of the semiconductor die. However, the magnetic field sensor components are positioned so that the magnetic field of interest impinges on the magnetic field sensor components in different directions, allowing for the influence of stray magnetic fields such as the earth's field to be suppressed e.g. by taking the difference of the sensor component electrical signal outputs. As such, current flow through the semiconductor die and temperature within the package can be measured more accurately.

Figure 14B:
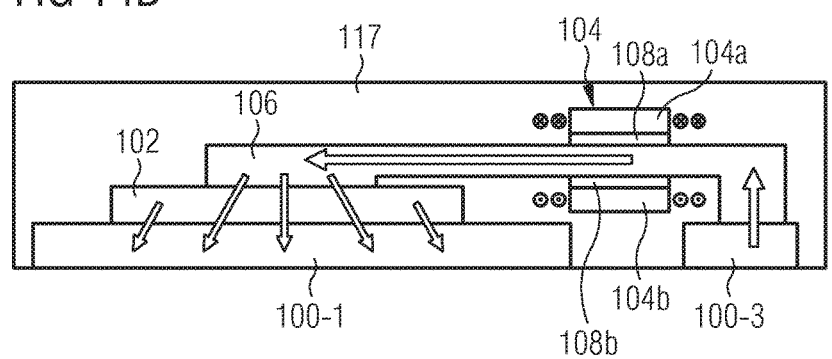
FIG. 14B illustrates a cross-sectional view of the package along the line labeled E-E' in FIG. 14A.

FIG. 14A illustrates a top down plan view of a fourteenth embodiment of the semiconductor package, and FIG. 14B illustrates a cross-sectional view of the package along the line labeled E-E' in FIG. 14A. The embodiment shown in FIGS. 14A and 14B is similar to the embodiment shown in FIGS. 1A and 1B. Different, however, the magnetic field sensor 104 comprises a first magnetic field sensing component 104a and a second magnetic field sensing component 104b. The second magnetic field sensing component 104b is covered by metal clip 106 and therefore out of view in FIG. 14A.

The first magnetic field sensing component 104a is adjacent the top side of metal clip 106 and galvanically isolated from the current pathway. The second magnetic field sensing component 104b is adjacent the bottom side of metal clip 106 and also galvanically isolated from the current pathway. The first and the second magnetic field sensing components 104a, 104b of the magnetic field sensor 104 are disposed in separate semiconductor dies according to this embodiment, because the sensor components 104a, 104b are adjacent opposite sides of the same metal clip 106. In one embodiment, a spacer 108a, 108b separates each magnetic field sensor component 104a, 104b from the metal clip 106. The spacer 108 can provide both galvanic isolation and magnetic field reduction at each sensor component 104a, 104b as previously described herein. The metal clip 106 electrically connects a lead 100-3 of the semiconductor package to a terminal (e.g. emitter or source terminal) of the semiconductor die 102.

With the sensor component configuration shown in FIGS. 14A and 14B, the first magnetic field sensing component 104a is positioned so that the magnetic field produced by current flowing in the current pathway impinges on the first magnetic field sensing component 104a in a first direction. The second magnetic field sensing component 104b is positioned so that the magnetic field impinges on the second magnetic field sensing component 104b in a second direction different than the first direction. The current pathway is illustrated by arrows in FIG. 14B.

Current enters lead 100-3, traverses metal clip 106 from right to left, enters the semiconductor die 102 and exits the package through lead 100-1. FIG. 14B illustrates a few vectors of the resulting magnetic field entering the page above the metal clip 106 by symbol ⊗ and a few vectors of the magnetic field exiting the page below the metal clip 106 by symbol ⊙. As such, the magnetic field of interest, i.e. the magnetic field produced by current flowing in the current pathway, impinges on the first and the second magnetic field sensing components 104a, 104b in opposite directions in this embodiment.

The magnetic field sensor 104 produces an electrical signal which is proportional to the sensed magnetic field. The electrical signal comprises a first signal component output by the first magnetic field sensing component 104a and a second signal component output by the first magnetic field sensing component. The difference of the electrical signals output by the magnetic field sensing components 104a, 104b suppresses (cancels in this case) the influence of stray magnetic fields because any stray magnetic fields that impinge on the magnetic field sensing components 104a, 104b do so in the same direction with the sensor component configuration shown in FIGS. 14A and 14B. The magnetic field of interest impinges on the magnetic field sensing components 104a, 104b in opposite directions with the sensor component configuration shown in FIGS. 14A and 14B, and therefore the measured magnitude of the magnetic field of interest is constructively combined to yield an accurate estimate of the current flowing in the current pathway without being influenced by stray magnetic fields.

Figure 15A:
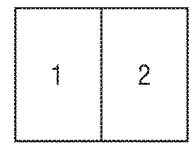
FIG. 15A illustrates vectors of a magnetic field produced by current flowing through a U-shaped metal clip.
Figure 15A:
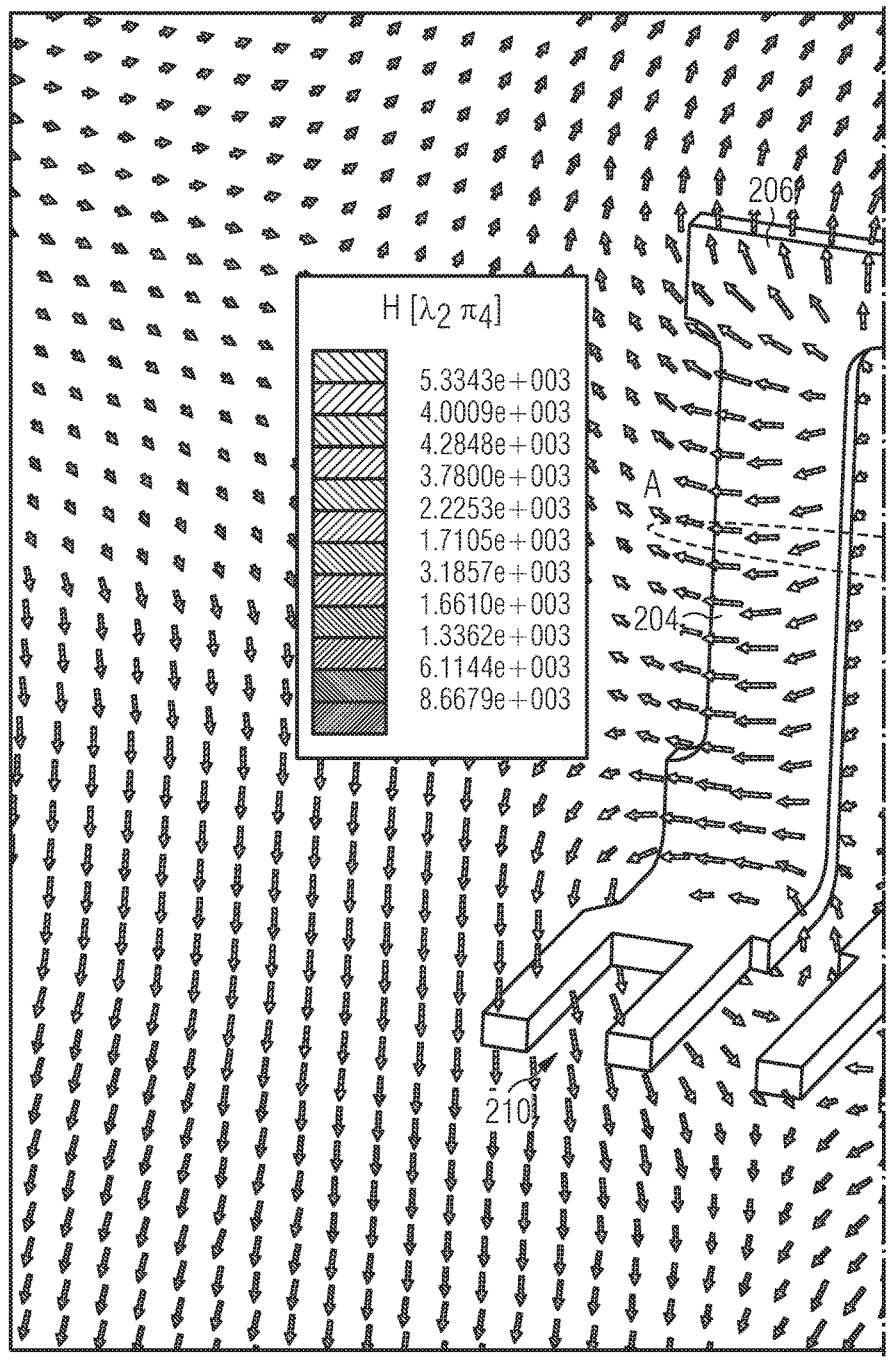
Figure 15A:
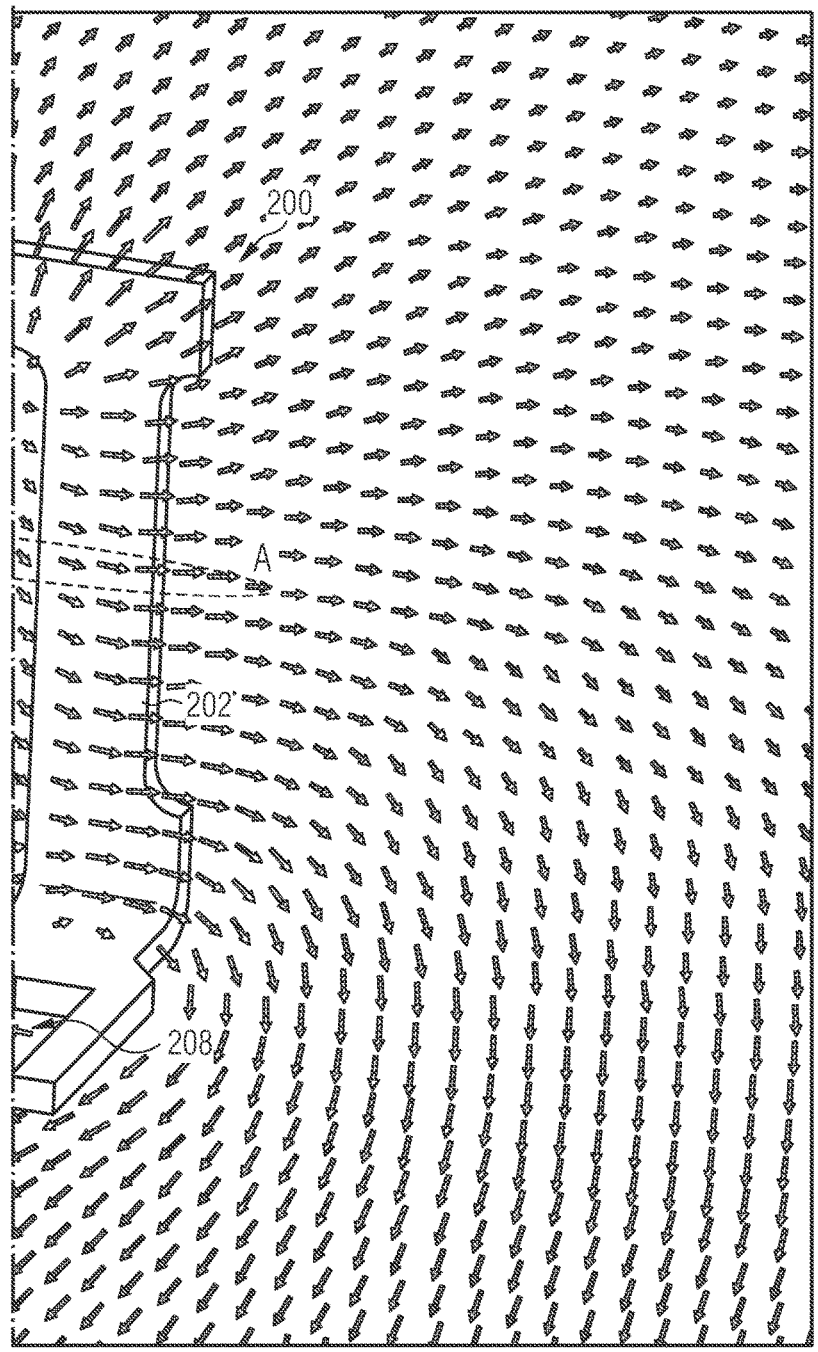

FIG. 15A illustrates vectors of a magnetic field produced by current flowing through a metal clip 200 having a first section 202 and a second section 204 which are spaced apart from each other and extend in parallel with one another as part of the current pathway. A third section 206 extends perpendicular between the first and the second sections 202, 204, and connects the first section 202 to the second section 204. The ends 208, 210 of the first and the second sections 202, 204 are not connected physically to one another. Current flowing in the metal clip 200 enters one end 208 and exits the other end 210. The current flows in the opposite direction in the first section 202 as compared to the second section 204. As a result, the magnetic field produced by the current flowing in the metal clip 200 propagates outward from the first section 202 in the opposite direction as compared to the second section 204.

FIG. 15B illustrates a sectional view of the metal clip 200 shown in FIG. 15A along the line labeled A-A. Current flows in one direction in the first section 202 of the metal clip 200 as represented by symbol ⊗ in FIG. 15B, and flows in the opposite direction in the second section 204 of the metal clip 200 as represented by symbol ⊙ in FIG. 15B. Also shown in FIG. 15B is a stray magnetic field which impinges on each section 202, 204 of the metal clip 200 in the same direction. FIG. 15B also shows a first vector 212, 212' representing the magnetic field of interest, a second vector 214, 214' representing the stray magnetic field and a third vector 216, 216' representing the combination of the first and second vectors measured for the first and the second sections 202, 204 of the metal clip 200. The influence of the stray magnetic field on the sensing results is clearly visible in FIG. 15B. The influence of the stray magnetic field can be suppressed by employing a differential measuring method, where a first magnetic field sensing component 104a is placed in close proximity to the first section 202 of the metal clip 200 and a second magnetic field sensing component 104b is placed in close proximity to the second section 204 of the metal clip 200. By taking the difference of the sensor component outputs (X1-X2), the influence of the homogeneous stray magnetic field is eliminated as indicated in the bottom part of FIG. 15B.

Figure 16B:
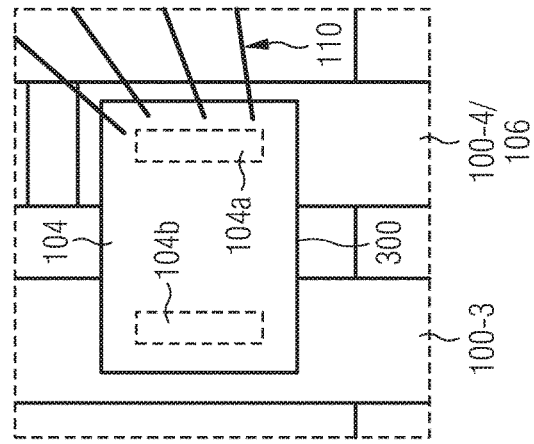
FIG. 16B illustrates an enlarged view of a region of the package shown in FIG. 16A.
Figure 16A:
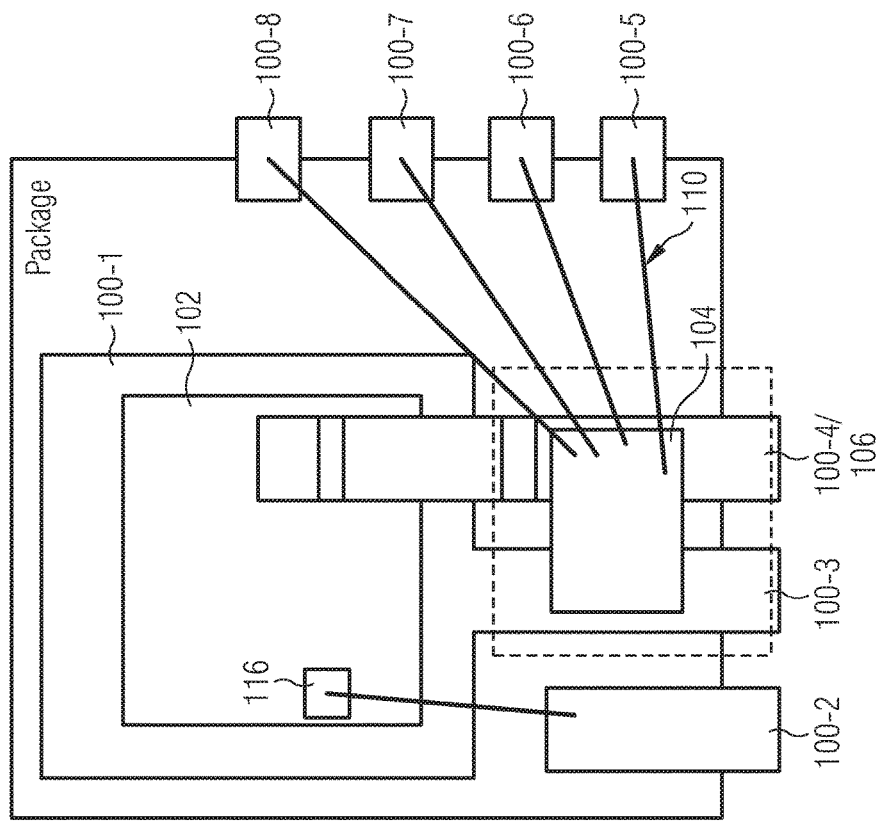
FIG. 16A illustrates a top down plan view of a fifteenth embodiment of a semiconductor package having an integrated magnetic field sensor.

FIG. 16A illustrates a top down plan view of a fifteenth embodiment of the semiconductor package, and FIG. 16B illustrates an exploded view of the region included in the dashed both shown in FIG. 16A. The embodiment shown in FIGS. 16A and 16B is similar to the embodiment shown in FIGS. 14A and 14B. Different, however, the first and the second magnetic field sensing components 104a, 104b of the magnetic field sensor 104 are integrated in the same sensor die 300 and therefore fixed in the same plane. The sensor die 300 is attached to different leads/metal clips 100-3, 100-4/106 of the semiconductor package. The first lead/metal clip 100-3 is electrically connected to a first terminal (e.g. collector or drain) of the semiconductor die 102, and the second metal clip 100-3 is electrically connected to a second terminal (e.g. emitter or source) of the semiconductor die 102. Current flowing in the current pathway traverses a different direction along the first lead/metal clip 100-4/106 than along the second lead/metal clip 100-3. The first magnetic field sensing component 104a is adjacent the first lead/metal clip 100-4/106 and the second magnetic field sensing component 104b is adjacent the second lead/metal clip 100-3. Current entering the semiconductor die 102 traverses the first lead/metal clip 100-4/106 in a first direction. Current exiting the semiconductor die 102 traverses the second lead/metal clip 100-3 in the opposite direction. As a result, the magnetic field produced by current flowing in the current pathway impinges on the first magnetic field sensing component 104a in the opposite direction as the first magnetic field sensing component 104a.

FIG. 17 illustrates a top down plan view of a sixteenth embodiment of the semiconductor package. The embodiment shown in FIG. 17 is similar to the embodiment shown in FIGS. 16A and 16B. Different, however, the sensor die that includes the first and the second magnetic field sensing components 104a, 104b is attached to the same lead/metal clip 100-4/106. The lead/metal clip 100-4/106 is electrically connected to a terminal (e.g. emitter or source) of the semiconductor die 102. The lead/metal clip 100-4/106 comprises a first section 400 and a second section 402 which are spaced apart from each other and extend in parallel with one another as part of the current pathway. A third section 404 of the lead/metal clip 100-4/106 extends perpendicular between the first and the second sections 400, 402, and connects the first section 400 to the second section 402. The ends of the first and the second sections 400, 402 are not connected physically to one another. Current flowing in the current pathway traverses a different direction along the first section 400 of the lead/metal clip 100-4/106 than along the second section 402 of the lead/metal clip 100-4/106 e.g. as previously described herein in connection with FIGS. 15A and 15B. The first magnetic field sensing component 104a is adjacent the first section 400 of the lead/metal clip 100-4/106, and the second magnetic field sensing component 104b is adjacent the second section 402 of the lead/metal clip 100-4/106. This way, current flowing in the lead/metal clip 100-4/106 impinges on the first magnetic field sensing component 104a in the opposite direction as the second magnetic field sensing component 104b so that stray field contributions are cancelled by the differential sensing method described herein.

In one embodiment, the first section 400 of the lead/metal clip 100-4/106 extends beyond the footprint of the semiconductor die 102 and the first magnetic field sensing component 104a is adjacent the first section 400 outside the footprint of the semiconductor die 102. The second magnetic field sensing component 104b is adjacent the second section 402 inside the footprint of the semiconductor die 102.

Figure 18:
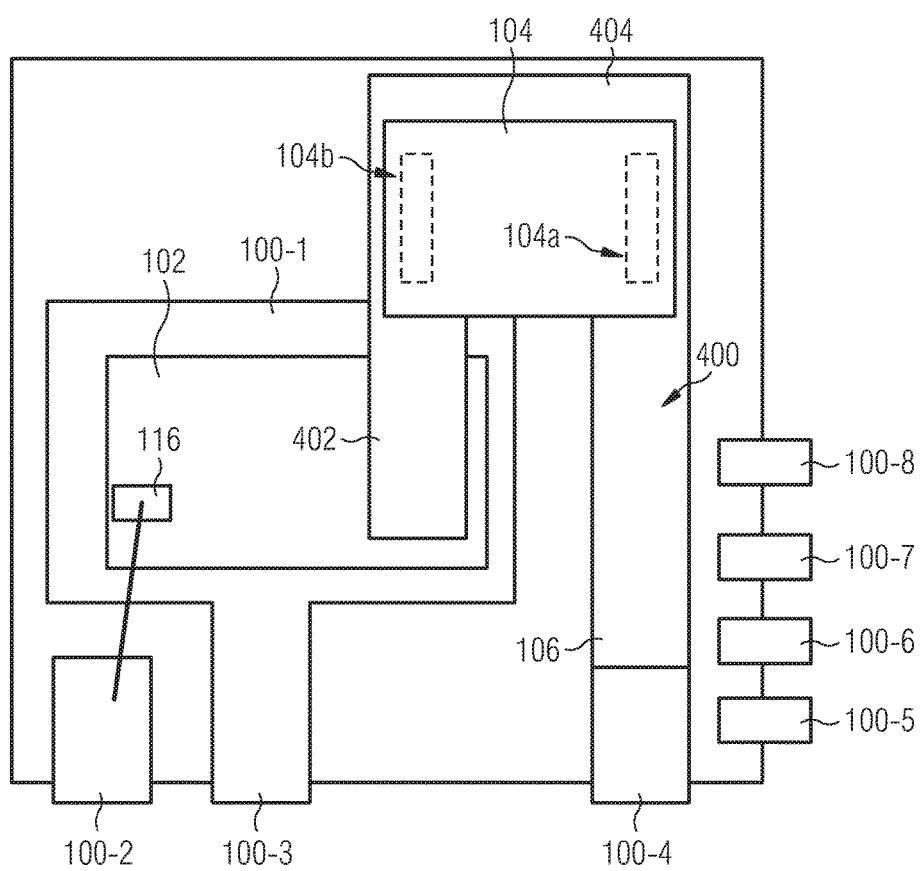
FIG. 18 illustrates a top down plan view of a seventeenth embodiment of a semiconductor package having an integrated magnetic field sensor.

FIG. 18 illustrates a top down plan view of a seventeenth embodiment of the semiconductor package. The embodiment shown in FIG. 18 is similar to the embodiment shown in FIG. 17. Different, however, the second section 402 of the lead/metal clip 100-4/106 also extends beyond the footprint of the semiconductor die 102. This way, both magnetic field sensing components 104a, 104b are adjacent to the respective sections 400, 402 of the lead/metal clip 100-4/106 outside the footprint of the semiconductor die 102. With this configuration, perturbations in the current flowing in the semiconductor die 102 have less effect on the magnetic field sensed by the magnetic field sensing components 104a, 104b of the magnetic field sensor 104, because the magnetic field sensing components 104a, 104b are not positioned over or under the semiconductor die 102 but instead are laterally offset from the die 102 in the vertical direction.

In one embodiment, the semiconductor die 102 includes a power transistor controlled by a switching signal applied to the gate 116 of the power transistor. The switching signal controls switching of the power transistor during which perturbations occur in current flowing through the power transistor. A difference signal corresponding to the difference between the electrical signals output by the magnetic field sensing components 104a, 104b of the magnetic field sensor 104 can be processed so as to suppress the effect of the perturbations on the measured magnetic field, based on timing information associated with the switching signal. For example, the switching signal can be a PWM (pulse width modulation) signal applied to the gate 116 of the power transistor. In this example, the timing information corresponds to at least one of the duty cycle and frequency of the PWM signal. A controller (not shown) which provides the PWM signal is aware of the duty cycle and frequency of the PWM signal. As such, the controller is aware of when the power transistor is switched on, switched off and how long the power transistor remains on or off. Based on this timing information, the controller knows when perturbations occur in current flowing through the power transistor and can process the difference signal to remove or at least reduce the influence of these perturbations on the measurement results produced by the sensor components 104a, 104b e.g. by ignoring, filtering, etc. the difference signal during known perturbation periods.

FIG. 19A illustrates a perspective view of an eighteenth embodiment of the semiconductor package, and FIG. 19B illustrates a more detailed plan view of the package shown in FIG. 19A. The embodiment shown in FIGS. 19A and 19B is similar to the embodiment shown in FIGS. 16A and 16B. Different, however, the magnetic field sensor 104 is attached to the outside of the package on the current carrying connections in order to sense the magnetic field. The semiconductor package can be, for example, a transistor outline (TO) package or other type of standard semiconductor package which has a first lead 3 electrically connected to a first terminal (e.g. emitter or source) of the semiconductor die 102, a second lead 2 electrically connected to a second terminal (e.g. collector or drain) of the semiconductor die 102, a third lead 1 electrically connected to a third terminal (e.g. gate) of the semiconductor die 102, and an encapsulant 500 encasing the semiconductor die 102. The leads 1, 2, 3 protrude from the encapsulant 500. The first and the second magnetic field sensing components 104a, 104b of the magnetic field sensor 104 are integrated in the same sensor die 502, and the sensor die 502 is attached to the same side of at least two of the leads 1, 2, 3, outside the encapsulant 500. The first magnetic field sensing component 104a extends along the first lead 3 and the second magnetic field sensing component 104b extends along the second lead 2. Current flowing in the current pathway traverses a different direction along the first lead 3 (e.g. emitter or source lead) than along the second lead 2 (e.g. collector or drain lead). In the configuration shown in FIGS. 19A and 19B, the current flows in the opposite direction along the first and the second leads 3, 2. As such, the magnetic field produced by the current flowing into the semiconductor die 102 along the first lead 3 and out of the semiconductor die 102 along the second lead 2 impinges on the first magnetic field sensing component 104a in the opposite direction as the second magnetic field sensing component 104b.

The semiconductor package may further include an additional substrate 504 attached to the leads 1, 2, 3, outside the encapsulant 500, the additional substrate being attached to the opposite side of the leads 1, 2, 3 as the sensor die 502. Terminals of the sensor die 502 are electrically connected to leads 506, 508, 510, 512 of the additional substrate 504 so as to provide points of external electrical contact for accessing the electrical signals output by the magnetic field sensing components 104, 104b of the magnetic field sensor 104 included in the sensor die 502.

Figure 20:
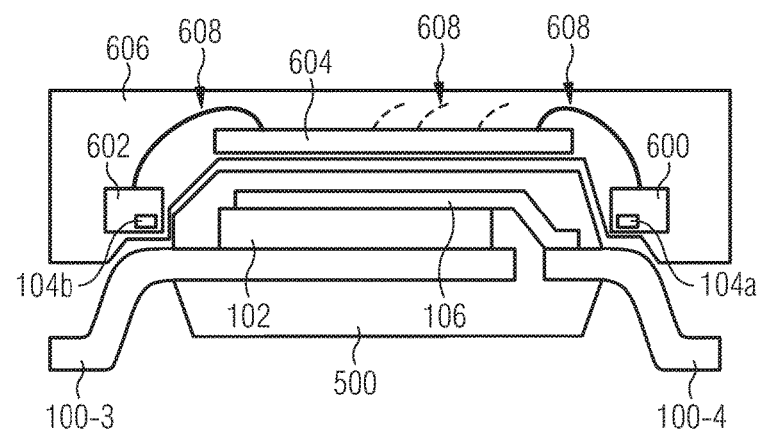
FIG. 20 illustrates a sectional view of a nineteenth embodiment of a semiconductor package having an integrated magnetic field sensor.

FIG. 20 illustrates a sectional view of a nineteenth embodiment of the semiconductor package. The embodiment shown in FIG. 20 is similar to the embodiment shown in FIGS. 19A and 19B. Different, however, is the type of package. According to the embodiment shown in FIG. 20, semiconductor package is a surface mount package. The emitter/source lead 100-4 of the semiconductor package protrudes from the encapsulant 500 at the opposite side of the package as the collector/drain lead 100-3. Current flowing in the current pathway traverses a different direction along the emitter/source lead 100-4 than along the collector/drain lead 100-3. The magnetic field sensing components 104a, 104b of the magnetic field sensor 104 are disposed in separate sensor dies 600, 602. The sensor die 600 with the first magnetic field sensing component 104a is attached to the emitter/source lead 100-4, and the sensor die 602 with the second magnetic field sensing component 104b is attached to the collector/drain lead 100-3.

The semiconductor package may further include an additional substrate 604 encased by an encapsulant 606. The same or different encapsulant can be used to encase the semiconductor die 102 and the additional substrate 604. Terminals of the separate sensor dies 600, 602 are electrically connected to leads of the additional substrate 604 by electrical conductors 608 such as wire bonds, wire ribbons, etc. so as to provide points of external electrical contact for accessing the electrical signals output by the magnetic field sensing components 104a, 104b of the magnetic field sensor 104.

The embodiments described in connection with FIGS. 14A to 20 allow for sensing of current in a semiconductor package which includes a semiconductor die attached to a substrate and a magnetic field sensor included as part of the same semiconductor package as the semiconductor die and positioned in close proximity to a current pathway of the semiconductor die. The current sensing method includes producing a first electrical signal by a first magnetic field sensing component which is galvanically isolated from the current pathway and positioned so that a magnetic field produced by current flowing in the current pathway impinges on the first magnetic field sensing component in a first direction, the first electrical signal being proportional to the magnetic field. The current sensing method also includes producing a second electrical signal by a second magnetic field sensing component which is galvanically isolated from the current pathway and positioned so that the magnetic field impinges on the second magnetic field sensing component in a different than the first direction, the second electrical signal being proportional to the magnetic field. The current sensing method further includes producing a third electrical signal as the difference between the first electrical signal and the second electrical signal.

The first and the second magnetic field sensing components can be positioned so that the magnetic field impinges on the first magnetic field sensing component in the opposite direction as the second magnetic field sensing component as previously described herein. This way, the magnitude of the magnetic field sensed by the first magnetic field sensing component is constructively combined with the magnitude of the magnetic field sensed by the second magnetic field sensing component and any stray magnetic field measurements made by the first and the second magnetic field sensing components are cancelled from the third electrical signal produced by the current sensing method.

In some cases, the semiconductor die may include one or more power transistors controlled by a switching signal that controls switching of the power transistor(s) during which perturbations occur in current flowing through the power transistor(s). For these cases, the current sensing method can further comprises processing the third electrical signal so as to suppress the effect of the perturbations on the magnetic field, based on timing information associated with the switching signal. For example, the switching signal can be a PWM (pulse width modulation) signal and the timing information corresponds to at least one of a duty cycle and frequency of the PWM signal. Based on this information, a controller which generates the PWM signal knows when perturbations occur in current flowing through the power transistor(s) and can process the third electrical signal so as to remove or at least reduce the influence of these perturbations on the measurement results produced by the magnetic field sensing components e.g. by ignoring, filtering, etc. the third electrical signal during known perturbation periods as previously described herein.

The embodiments previously described herein in connection with FIGS. 1-20 provide for the integration of a magnetic field sensor such as a magnetoresistive (XMR) sensor or a Hall sensor into a semiconductor package. The embodiments described next in connection with FIGS. 21-37 pertain to a stand-alone multi-functional interconnect module that includes a magnetic field sensor such as an XMR sensor or Hall sensor for current and/or temperature measurement. The magnetic field sensor functions as previously described herein, and generates a signal in response to a magnetic field produced by current flowing in a current pathway of a metal clip included in the stand-alone multi-functional interconnect module. The stand-alone multi-functional interconnect module can include one or more magnetic field sensing components and be provided with or without galvanic isolation between the magnetic field sensor and the metal clip also as previously described herein.

The stand-alone multi-functional interconnect module can be used to form a direct electrical connection between components and/or metal regions of a carrier assembly. The term 'carrier' as used herein broadly refers to any type of substrate, assembly or housing to which one or more bare and/or packaged semiconductor dies are attached or included. For example, the term 'carrier' can refer to a circuit board such as a PCB, a ceramic substrate, a plastic module, a molded module, a leadframe, or any other type of carrier. In one case, a bare semiconductor die or packaged semiconductor die such as a molded semiconductor die can be attached to a carrier such as a PCB and the multi-functional interconnect module can be used to form an electrical connection between the bare die/packaged die and a metal region of the carrier, between the bare die/packaged die and another bare die/packaged die attached to the carrier, or between two different metal regions of the carrier e.g. in a shunt configuration.

Figure 21:
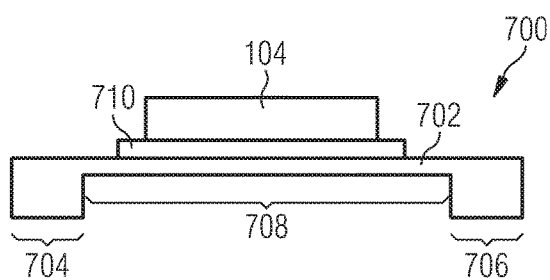
FIGS. 21 through 23 illustrate respective sectional views of three different embodiments of a stand-alone multi-functional interconnect module which includes a magnetic field sensor.
Figure 22:
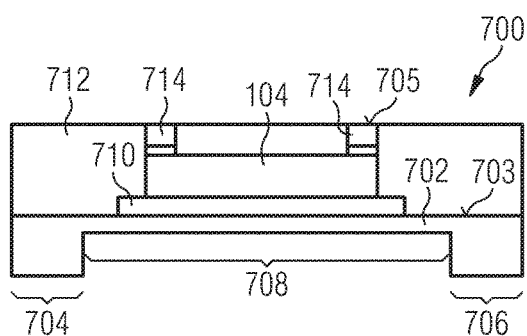
Figure 23:
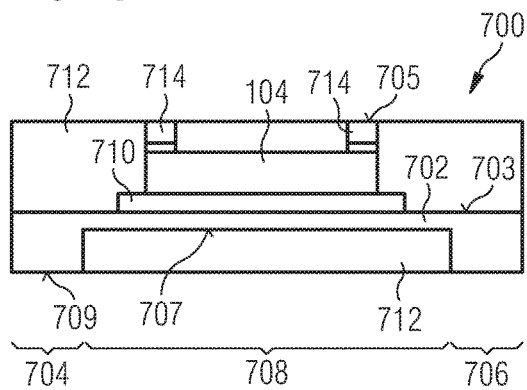

FIGS. 21 through 23 illustrate respective sectional views of three different embodiments of a stand-alone multi-functional interconnect module 700. According to the embodiment shown in FIG. 21, the multi-functional interconnect module 700 comprises a metal clip 702 having a first end section 704, a second end section 706 and a middle section 708 extending between the first and second end sections 704, 706. The metal clip 702 can have a single, continuous construction so that no physical boundaries or joints are present between the end sections 704, 706 and the middle section 708 of the metal clip 702. The first end section 704 of the metal clip 702 is configured for external attachment to a bare semiconductor die or packaged semiconductor die attached to a carrier such or to a metal region of the carrier (not shown in FIG. 21). The second end section 706 of the metal clip 702 is similarly configured for external attachment to a different metal region of the carrier or to a different semiconductor die or packaged semiconductor die attached to the carrier (also not shown in FIG. 21).

The multi-functional interconnect module 700 further comprises a magnetic field sensor 104 secured to the metal clip 702. The magnetic field sensor 104 is secured to the middle section 708 of the metal clip 702 at the top main surface in FIGS. 21 through 23. In general, the magnetic field sensor 104 can be attached to any section 704, 706, 708 of the metal clip 702 at either the top or bottom main surface of the clip 702 e.g. as previously described herein, and can be centred on the metal clip 702, or even overhang the clip 702. The magnetic field sensor 104 is operable to sense a magnetic field produced by current flowing through the metal clip 702 as previously described herein. For example, the magnetic field sensor 104 can be an XMR sensor such as an anisotropic magnetoresistive (AMR) sensor, giant magnetoresistive (GMR) sensor or tunnel magnetoresistive (TMR) sensor, or a Hall sensor that generates a signal in response to the magnetic field produced by current flowing in a current pathway of the metal clip 702.

The magnetic field sensor 104 can be secured to the metal clip 702 by an electrically conductive or non-conductive material or by a spacer 710. In some applications, the magnetic field sensor 104 may be powered or carry signals at a significantly lower voltage (e.g. 5V) as compared to the semiconductor die which causes current to flow through the clip 702 (e.g. 500V, 1000V or even higher). For these applications, the magnetic field sensor 104 can be galvanically isolated from the metal clip 702. In one embodiment, the magnetic field sensor 104 is spaced apart from the metal clip by a spacer 710. The spacer 710 can be electrically conductive or electrically insulating. For example, the spacer 710 can be a conductive adhesive, sinter material, solder, etc. for applications in the low to medium voltage range (e.g. up to 500V). In another example, the material of the spacer 710 can be chosen so as to provide galvanic isolation. A conductive adhesive can be used as the spacer 710 in the case the clip voltage and microcontroller for the sensor 104 has no voltage difference, or the voltage spikes on the clip 702 are blocked by other components. Otherwise, the spacer 710 can provide galvanic isolation e.g. with nonconductive glue. The thickness of the glue influences the response of the magnetic field sensor 104 and the galvanic isolation level. The spacer material and dimensions can be selected to optimize minimal detected current, maximal detected current and galvanic isolation level.

The thickness of the spacer 710 can be chosen so that the strength of the magnetic field which enters the magnetic field sensor 104 is reduced to a non-destructive level. A relatively thick spacer is particularly advantageous for high current applications. In one embodiment, the spacer 710 is a semiconductor die such as a silicon die interposed between the magnetic field sensor 104 and the metal clip 702. In other embodiments, the spacer 710 can be a polymer, ceramic, non-conductive adhesive, non-conductive film, or any other single or multi-layer material which separates the magnetic field sensor 104 from the metal clip 702. Alternatively, the magnetic field sensor 104 can be directly attached to the metal clip 702 e.g. by solder if the sensor 104 has a solderable backside or by a non-electrically conductive adhesive.

For each of these configurations, the multi-functional interconnect module 700 is a stand-alone component. That is, the multi-functional interconnect module 700 does not contain the component that causes current to flow through the metal clip 702 of the interconnect module 700 i.e. the component whose current and/or temperature is to be measured by the interconnect module 700.

FIG. 22 shows a second embodiment of the multi-functional interconnect module 700, in which the metal clip 702 is embedded in an encapsulant 712. Any standard encapsulation material can be used such an adhesive, mold compound, a laminate like FR-4 or FR-5, a photoresist such as a solder mask material, glass, silicon, etc. In FIG. 22, the encapsulant 712 covers the surface 703 of the metal clip 702 to which the magnetic field sensor 104 is secured. The magnetic field sensor 104 can be embedded in the encapsulant 712 also as shown in FIG. 22. Electrical contact pads 714 disposed at the side of the magnetic field sensor 104 facing away from the metal clip 702 have an exposed surface 705 that is uncovered by the encapsulant 712 to allow later electrical connection to the sensor 104.

FIG. 23 shows a third embodiment of the multi-functional interconnect module 700, in which the surface 707 of the middle section 708 of the metal clip 702 facing away from the magnetic field sensor 104 is also covered by the encapsulant 712. The first and second end sections 704, 706 of the metal clip 702 each have an exposed surface 709 facing away from the magnetic field sensor 104 that is uncovered by the encapsulant 712 to allow later attachment to a bare semiconductor die or packaged semiconductor die mounted to a carrier or to a metal region of the carrier (not shown in FIG. 23).

Figure 24:
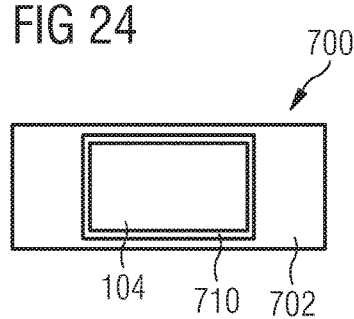
FIG. 24 illustrates a top plan view of the multi-functional interconnect module embodiment shown in FIG. 21.
Figure 25:
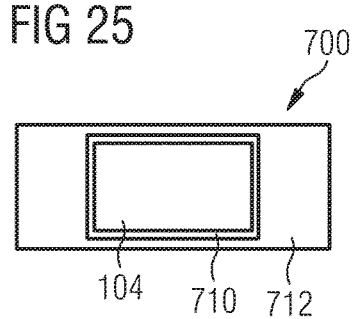
FIG. 25 illustrates a top plan view of the multi-functional interconnect module embodiments shown in FIGS. 22 and 23.

FIG. 24 illustrates a top plan view of the multi-functional interconnect module embodiment shown in FIG. 21, and FIG. 25 illustrates a top plan view of the multi-functional interconnect module embodiments shown in FIGS. 22 and 23.

Figure 26:
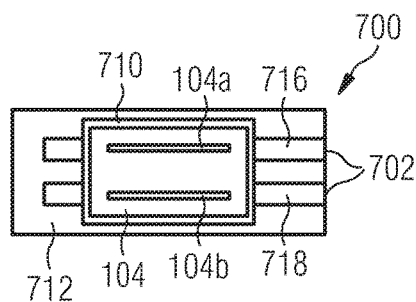
FIGS. 26 and 27 illustrate respective top plan views of the multi-functional interconnect module embodiments shown in FIGS. 22 and 23, with the magnetic field sensor operable to implement differential sensing.
Figure 27:
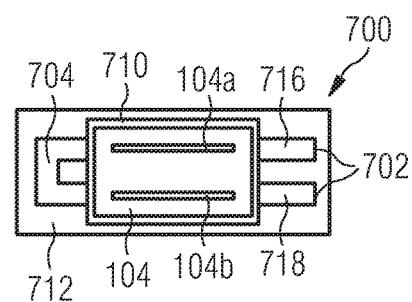

FIGS. 26 and 27 illustrate respective top plan views of the multi-functional interconnect module embodiments shown in FIGS. 22 and 23, with the magnetic field sensor 104 operable to implement the differential sensing method previously described herein in connection with FIGS. 20-19. According to these embodiments, the magnetic field sensor 104 comprises a first magnetic field sensing component 104a and a second magnetic field sensing component 104b. Also, the middle section 708 of the metal clip 702 comprises a first leg 716 and a second leg 718 spaced apart from the first leg 716. In the embodiment shown in FIG. 26, the first and second legs 716, 718 are not connected at either end of the clip 702. In the embodiment shown in FIG. 27, the first and second legs 716, 718 are connected at one end 704 of the clip. The first magnetic field sensing component 104a of the magnetic field sensor 104 is adjacent the first leg 716 and positioned so that a magnetic field produced by current flowing in the first leg 716 impinges on the first magnetic field sensing component 104a in a first direction. The second magnetic field sensing component 104b of the magnetic field sensor 104 is adjacent the second leg 718 and positioned so that the magnetic field impinges on the second magnetic field sensing component 104b in a second direction different than the first direction.

In the configurations shown in FIGS. 26 and 27, the first and second directions are opposite one another. The electrical signal produced by the magnetic field sensor 104 comprises a first signal component output by the first magnetic field sensing component 104a and a second signal component output by the second magnetic field sensing component 104b. This way, current flowing in the metal clip 702 impinges on the first magnetic field sensing component 104a in the opposite direction as the second magnetic field sensing component 104b so that stray field contributions are cancelled by differential sensing as previously described herein. The magnetic field sensor 104 shown in FIGS. 26-27 can be covered by the corresponding encapsulant 712 of the multi-functional interconnect module 700 as shown in FIGS. 22 and 23, but are not illustrated this way in FIGS. 26-27 so that the position of the magnetic field sensing components 104a, 104b relative to the legs 716, 718 of the metal clip 702 is visible.

FIGS. 28-37 illustrate different embodiments of using one or more instances of the multi-functional interconnect module 700 to form a direct electrical connection between components and/or metal regions of a carrier assembly.

FIG. 28 illustrates a top plan view of a first embodiment of a carrier assembly 800 which uses multiple instances of the multi-functional interconnect module 700. According to this embodiment, the carrier assembly 800 comprises a carrier 802 such as a circuit board, a ceramic substrate, a plastic module, a molded module, a leadframe, etc. which has a plurality of metal regions 804 embedded in or attached to an electrically insulating material 806 such as a laminate like FR-4 or FR-5, a mold compound, a ceramic substrate, etc. Bare semiconductor dies and/or packaged semiconductor dies 808 are attached to different metal regions 804 of the carrier 802. A plurality of the multi-functional interconnect modules 700 form direct electrical connections between the bare semiconductor dies/packaged semiconductor dies 808 and/or metal regions 804 of the carrier 802. Each interconnect module 700 comprises a metal clip 702 having a first end section 704, a second end section 706 and a middle section 708 extending between the first and the second end sections 704, 706. The first end section 704 is attached to one of the bare semiconductor dies/packaged semiconductor dies 808 mounted to the carrier 802. The second end section 706 is attached to one of the carrier metal regions 804. This way, each multi-functional interconnect module 700 provides a direct electrical connection between one of the bare semiconductor dies/packaged semiconductor dies 808 and one of the metal regions 804 of the carrier 802. These connections are out of view in FIG. 28.

Each interconnect module 700 also comprises a magnetic field sensor 104 secured to the respective metal clip 702 as previously described herein in connection with FIGS. 21-23.

The metal clips 702 of the respective interconnect modules 700 can be embedded in an encapsulant 712 also as previously described herein in connection with FIGS. 22 and 23. One or more of the bare semiconductor dies/packaged semiconductor dies 808 attached to the carrier 802 can be powered or carry signals at a significantly higher voltage (e.g. 500V, 1000V or even higher) than the adjacent magnetic field sensor 104 (e.g. 5V). For these applications, galvanic isolation can be provided between the magnetic field sensor 104 and the corresponding metal clip 702 as previously described herein.

Figure 29B:
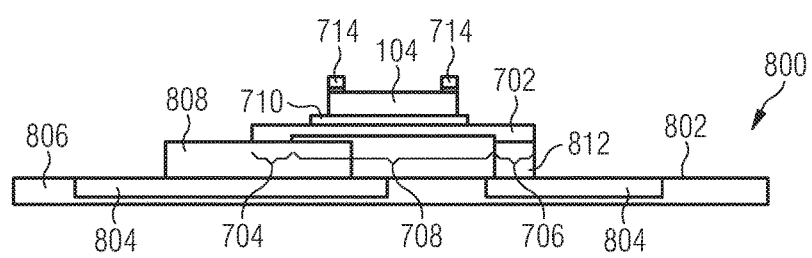
FIG. 29B illustrates a sectional view of the carrier assembly of FIG. 29A along the line labelled F-F' in FIG. 29A.

FIG. 29A illustrates a top plan view of a second embodiment of the carrier assembly 800 which uses the version of the multi-functional interconnect module 700 shown in FIG. 21, and FIG. 29B illustrates a sectional view of the carrier assembly 800 along the line labelled F-F' in FIG. 29A. According to this embodiment, a plurality of electrical conductors 810 such as wire bonds, wire ribbons, etc. connect different ones of the metal regions 804 of the carrier 802 to electrical contact pads 714 disposed at a side of the magnetic field sensor 104 of the multi-functional interconnect module 700 which faces away from the metal clip 702 of that module 700. These connections allow signals from the magnetic field sensor 104 to be carried to the carrier 802. A standoff 812 such as a metal block can be used to accommodate any gap between the second end section 706 of the metal clip 702 and the carrier 802 that results from attaching the first end section 704 to one of the bare semiconductor dies/packaged semiconductor dies 808. Alternatively, the gap can be accommodated by making the second end section 706 of the metal clip 702 thicker (taller) than the first end section 704.

Figure 29C:
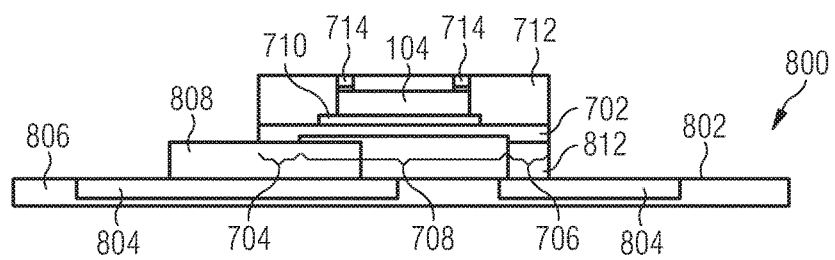
FIG. 29C illustrates the same sectional view of the carrier assembly along the line labelled F-F' in FIG. 29A, but with the version of the multi-functional interconnect module shown in FIG. 22.

FIG. 29C illustrates the same sectional view of the carrier assembly 800 along the line labelled F-F' in FIG. 29A, but with the version of the multi-functional interconnect module 700 shown in FIG. 22.

Figure 29D:
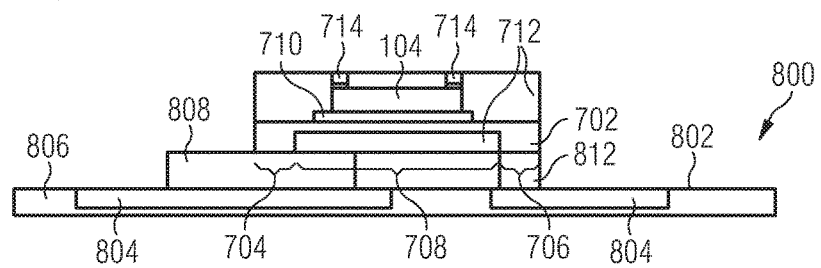
FIG. 29D illustrates the same sectional view of the carrier assembly along the line labelled F-F' in FIG. 29A, but with the version of the multi-functional interconnect module shown in FIG. 23.

FIG. 29D also illustrates the same sectional view of the carrier assembly 800 along the line labelled F-F' in FIG. 29A, but with the version of the multi-functional interconnect module 700 shown in FIG. 23.

Figure 30:
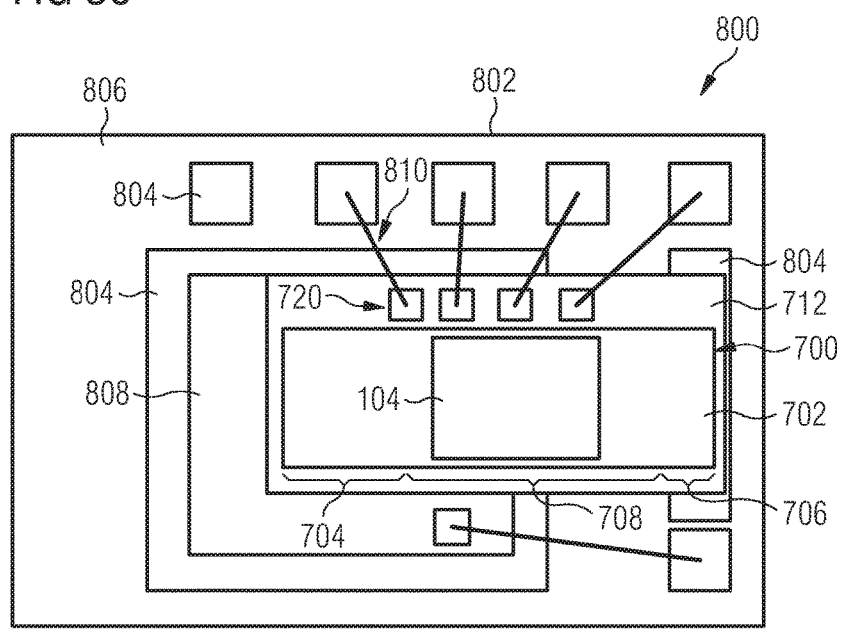
FIG. 30 illustrates a top plan view of a third embodiment of a carrier assembly which uses the multi-functional interconnect module.

FIG. 30 illustrates a top plan view of a third embodiment of the carrier assembly 800 which uses the multi-functional interconnect module 700. The embodiment shown in FIG. 30 is similar to the embodiment shown in FIG. 29A. Different, however, the interconnect module 700 further comprises a metal redistribution layer 720 which is embedded in the same encapsulant 712 as the metal clip 702 and separated from the metal clip 702. The metal redistribution layer 720 can be electrically connected to contact pads of the magnetic field sensor 104 disposed at the front side (which are not shown) and/or back side (which are out of view) of the sensor 104. The top side of the metal clip 702 and magnetic field sensor 104 can be covered by the encapsulant 712 as shown in FIGS. 22 and 23, but are not illustrated this way in FIG. 30 so that the position of the magnetic field sensor 104 and metal clip 702 relative to the metal redistribution layer 720 is visible. A plurality of electrical conductors 810 such as wire bonds, wire ribbons, etc. connect different ones of the metal regions 804 of the carrier 802 to the metal redistribution layer 720 of the interconnect module 700.

Figure 31:
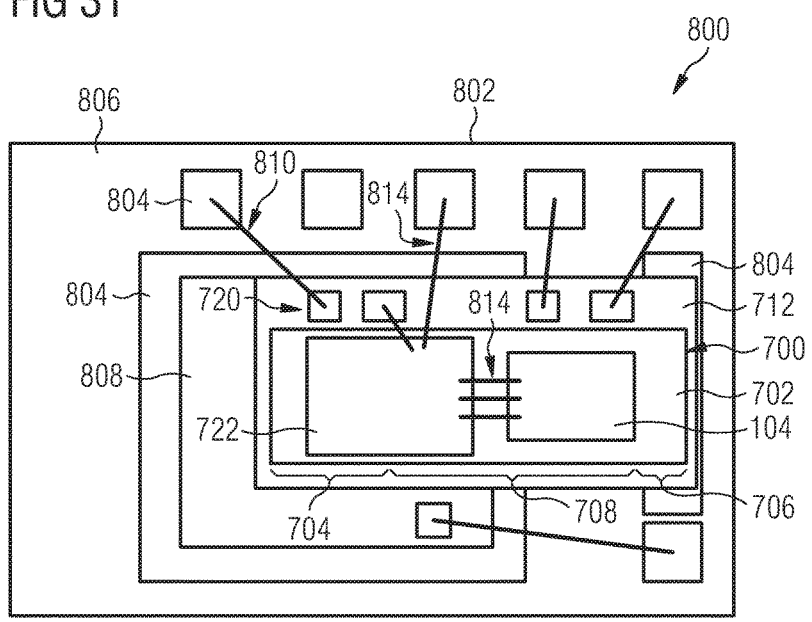
FIG. 31 illustrates a top plan view of a fourth embodiment of a carrier assembly which uses the multi-functional interconnect module.

FIG. 31 illustrates a top plan view of a fourth embodiment of the carrier assembly 800 which uses the multi-functional interconnect module 700. The embodiment shown in FIG. 31 is similar to the embodiment shown in FIG. 30. Different, however, the interconnect module 700 further comprises a logic device 722 secured to the metal clip 702 and operable to control the magnetic field sensor 104. The metal clip 702, magnetic field sensor 104 and logic device 722 can be covered by the encapsulant 712, but are not illustrated this way in FIG. 31 so that the position of the magnetic field sensor 104, metal clip 702 and logic device 722 relative to the metal redistribution layer 720 is visible. A plurality of electrical conductors 810 such as wire bonds, wire ribbons, etc. connect different ones of the metal regions 804 of the carrier 802 to the metal redistribution layer 720 of the interconnect module 700, and further electrical conductors 814 can be provided for directly electrically connecting the logic device 722 and/or the magnetic field sensor 104 to metal regions 804 of the carrier 802 and/or to the metal redistribution layer 720.

Figure 32:
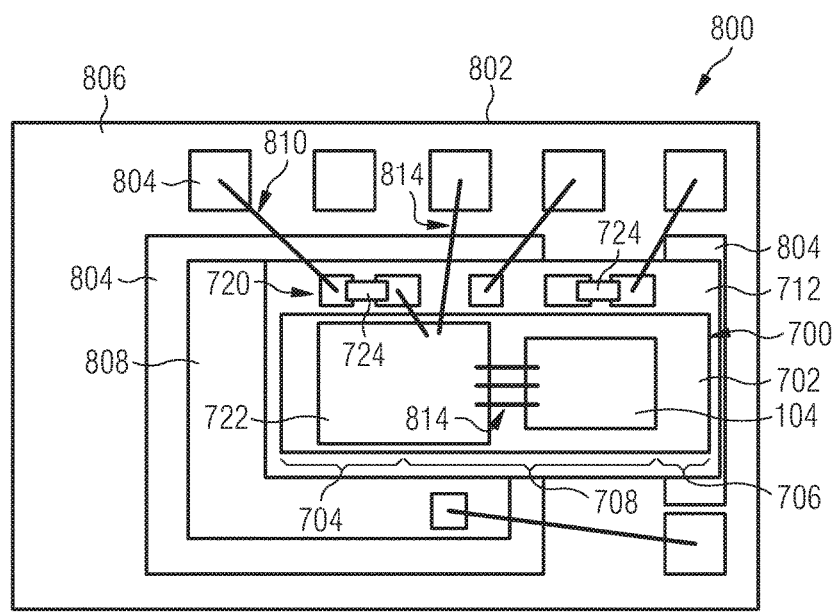
FIG. 32 illustrates a top plan view of a fifth embodiment of a carrier assembly which uses the multi-functional interconnect module.

FIG. 32 illustrates a top plan view of a fifth embodiment of the carrier assembly 800 which uses the multi-functional interconnect module 700. The embodiment shown in FIG. 32 is similar to the embodiment shown in FIG. 31. Different, however, the interconnect module 700 further comprises one or more passive devices 724 such as capacitors, resistors, etc. attached to the metal redistribution layer 720 of the multi-functional interconnect module 700. The metal clip 702, magnetic field sensor 104, logic device 722 and passive devices 724 can be covered by the encapsulant 712, but are not illustrated this way in FIG. 32 so that the position of the magnetic field sensor 104, metal clip 702, logic device 722 and passive devices 724 relative to the metal redistribution layer 720 is visible.

Figure 33:
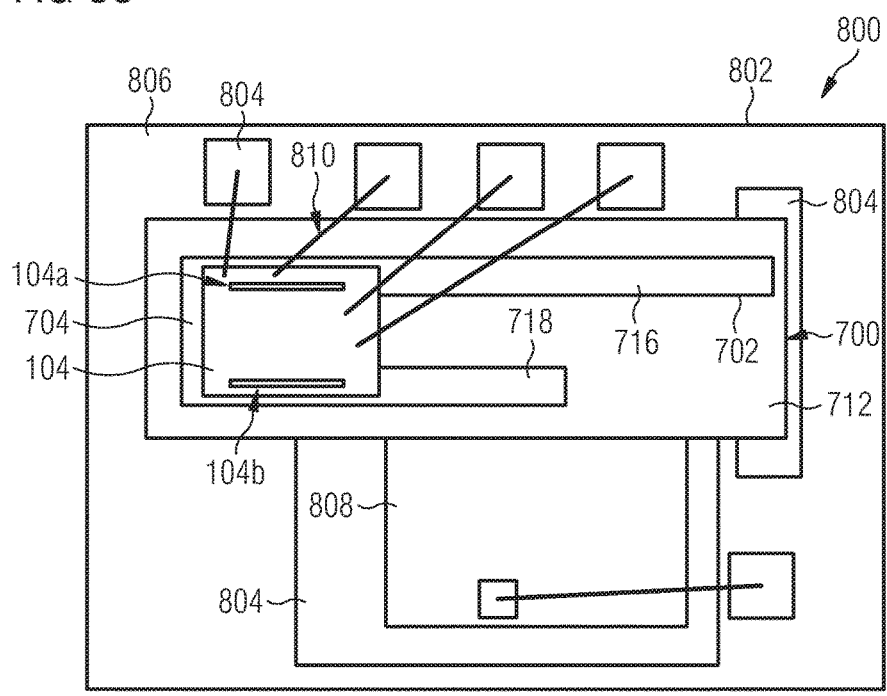
FIG. 33 illustrates a top plan view of a sixth embodiment of a carrier assembly which uses the multi-functional interconnect module.

FIG. 33 illustrates a top plan view of a sixth embodiment of the carrier assembly 800 which uses the version of the multi-functional interconnect module 700 shown in FIG. 27. According to this embodiment, the middle section 708 of the metal clip 702 of the interconnect module 700 comprises a first leg 716 and a second leg 718 spaced apart from the first leg 716. The magnetic field sensor 104 comprises a first magnetic field sensing component 104a adjacent the first leg 716 of the metal clip 702 and positioned so that a magnetic field produced by current flowing in the first leg 716 impinges on the first magnetic field sensing component 104a in a first direction, and a second magnetic field sensing component 104b adjacent the second leg 718 of the metal clip 702 and positioned so that the magnetic field impinges on the second magnetic field sensing component 104b in a second direction different than the first direction. The main current carried between the bare semiconductor die/packaged semiconductor die 808 and the corresponding carrier metal region 804 flows through the metal clip 702 of the multi-functional interconnect module 700 and changes direction along the length of the metal clip 702 so that stray field contributions are cancelled by differential sensing implemented at the magnetic field sensor 104 as previously described herein.

Figure 34:
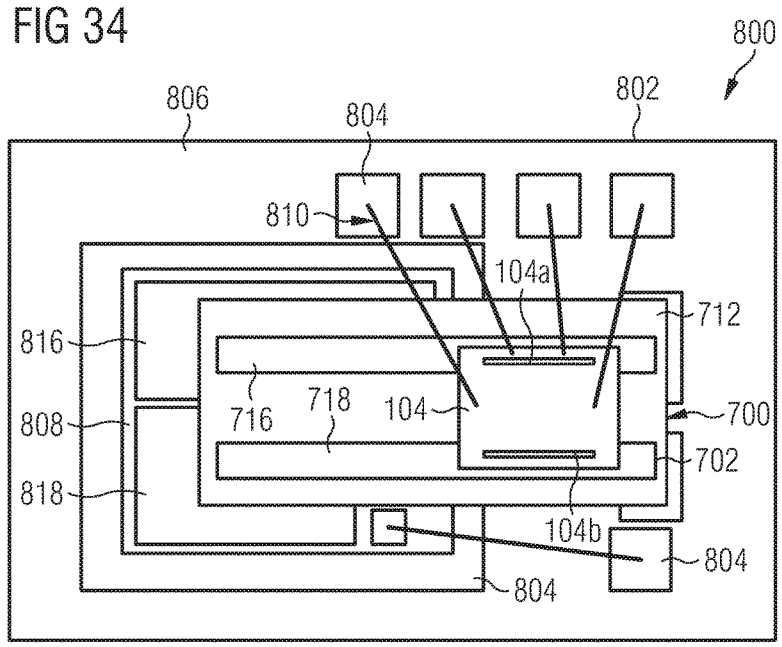
FIG. 34 illustrates a top plan view of a seventh embodiment of a carrier assembly which uses the multi-functional interconnect module.

FIG. 34 illustrates a top plan view of a seventh embodiment of the carrier assembly 800 which uses the version of the multi-functional interconnect module 700 shown in FIG. 26. According to this embodiment, the bare semiconductor die/packaged semiconductor die 808 is a lateral transistor device with all power terminals at a side facing the interconnect module 700. The middle section 708 of the metal clip 702 of the interconnect module 700 comprises a first leg 716 and a second leg 718 spaced apart from the first leg 716. The first leg 716 of the metal clip 702 provides a direct electrical connection between a first top-side power terminal 816 of the bare semiconductor die/packaged semiconductor die 808 and one metal region 804 of the carrier 802. The second leg 718 of the metal clip 702 provides a direct electrical connection between a second top-side power terminal 818 of the bare semiconductor die/packaged semiconductor die 808 and a different metal region 804 of the carrier 802. The magnetic field sensor 104 comprises a first magnetic field sensing component 104a adjacent the first leg 716 of the metal clip 702 and positioned so that a magnetic field produced by current flowing in the first leg 716 impinges on the first magnetic field sensing component 104a in a first direction, and a second magnetic field sensing component 104b adjacent the second leg 718 of the metal clip 702 and positioned so that the magnetic field impinges on the second magnetic field sensing component 104v in a second direction different than the first direction.

FIG. 35 illustrates a top plan view of an eighth embodiment of the carrier assembly 800 which uses the version of the multi-functional interconnect module 700 shown in FIG. 26. According to this embodiment, the bare semiconductor die/packaged semiconductor die 808 is a vertical transistor device with a first power terminal (out of view) at its bottom side and attached to a first metal region 804 of the carrier 802, and a second power terminal 818 at a side facing the interconnect module 700. The middle section 708 of the metal clip 702 of the interconnect module 700 comprises a first leg 716 and a second leg 718 spaced apart from the first leg 716. The first leg 716 of the metal clip 702 provides a direct electrical connection between first metal region 804 of the carrier 702 and a second metal region 804 of the carrier 802. The second leg 718 of the metal clip 702 provides a direct electrical connection between the (second) power terminal 818 at the top-side of the bare semiconductor die/packaged semiconductor die 808 and a third metal region 804 of the carrier 802. The magnetic field sensor 104 comprises a first magnetic field sensing component 104a adjacent the first leg 716 of the metal clip 702 and positioned so that a magnetic field produced by current flowing in the first leg 716 impinges on the first magnetic field sensing component 104a in a first direction, and a second magnetic field sensing component 104b adjacent the second leg 718 of the metal clip 702 and positioned so that the magnetic field impinges on the second magnetic field sensing component 104b in a second direction different than the first direction.

FIG. 36 illustrates a top plan view of an ninth embodiment of the carrier assembly 800 which uses the version of the multi-functional interconnect module 700 shown in any one of FIGS. 21-27. While the multi-functional interconnect module 700 is shown with an encapsulant 712 as described in connection with FIGS. 22-23 and 25-27, the encapsulant 712 can be omitted as described in connection with FIGS. 21 and 24. In either case, at least two bare semiconductor dies/packaged semiconductor dies 808 are attached to respective metal regions 804 of the carrier 802. The first end section 704 of the metal clip 702 (out of view in FIG. 36) of the interconnect module 700 is attached to a first one of the bare semiconductor dies/packaged semiconductor dies 808 and the second end section 706 of the metal clip 702 (also out of view in FIG. 36) is attached to a second one of the bare semiconductor dies/packaged semiconductor dies 808, so as to provide a direct electrical connection between two bare semiconductor dies/packaged semiconductor dies 808 via the interconnect module 700.

FIG. 37 illustrates a top plan view of an tenth embodiment of the carrier assembly 800 which uses the version of the multi-functional interconnect module 700 shown in any one of FIGS. 21-27. While the multi-functional interconnect module 700 is again shown with an encapsulant 712 as described in connection with FIGS. 22-23 and 25-27, the encapsulant 712 can be omitted as described in connection with FIGS. 21 and 24. In either case, the carrier assembly embodiment shown in FIG. 37 is similar to the embodiment shown in FIG. 36. Different, however, the first end section 704 of the metal clip 702 (out of view in FIG. 36) of the interconnect module 700 is attached to a first metal region 804 of the carrier 802 and the second end section 706 of the metal clip 702 (also out of view in FIG. 36) is attached to a second metal region 804 of the carrier 802, so as to provide a direct electrical connection between the two metal regions 804 of the carrier 802. In some cases, the two metal regions 804 may be grounded so as to provide a source connection to the corresponding bare semiconductor dies/packaged semiconductor dies 808 via the respective carrier metal regions 804. In these cases, the magnetic field sensor 104 of the multi-functional interconnect module 700 can be used to sense temperature and/or current.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An interconnect module, comprising:
a metal clip comprising a first end section, a second end section and a middle section extending between the first and the second end sections, the first end section being configured for external attachment to a bare semiconductor die or packaged semiconductor die attached to a carrier or to a metal region of the carrier, the second end section being configured for external attachment to a different metal region of the carrier or to a different semiconductor die or packaged semiconductor die attached to the carrier; and
a magnetic field sensor secured to the metal clip, the magnetic field sensor operable to sense a magnetic field produced by current flowing through the metal clip,
wherein the metal clip is electrically connected to the bare semiconductor die or the packaged semiconductor die so that the metal clip and the bare semiconductor die or the packaged semiconductor die form part of a current pathway.

2. The interconnect module of claim 1, wherein the magnetic field sensor is galvanically isolated from the metal clip.

3. The interconnect module of claim 1, wherein the metal clip is embedded in an encapsulant, and wherein electrical contact pads disposed at a side of the magnetic field sensor facing away from the metal clip have an exposed surface that is uncovered by the encapsulant.

4. The interconnect module of claim 3, wherein a surface of the middle section of the metal clip facing away from the magnetic field sensor is covered by he encapsulant, and wherein the first end section and the second end section each have an exposed surface facing away from the magnetic field sensor that is uncovered by the encapsulant.

5. The interconnect module of claim 3, wherein the encapsulant is an adhesive, mold compound or a laminate.

6. The interconnect module of claim 1, further comprising:
a metal redistribution layer embedded in the encapsulant and separated from the metal clip.

7. The interconnect module of claim 1, wherein the middle section of the metal clip comprises a first leg and a second leg spaced apart from the first leg, and wherein the magnetic field sensor comprises a first magnetic field sensing component adjacent the first leg and positioned so that a magnetic field produced by current flowing in the first leg impinges on the first magnetic field sensing component in a first direction and a second magnetic field sensing component adjacent the second leg and positioned so that the magnetic field impinges on the second magnetic field sensing component in a second direction different than the first direction.

8. The interconnect module of claim 7, wherein the magnetic field sensor is operable to produce an electrical signal which is proportional to the magnetic field, and wherein the electrical signal comprises a first signal component output by the first magnetic field sensing component and a second signal component output by the first magnetic field sensing component.

9. The interconnect module of claim 1, further comprising:
a logic device secured to the metal clip and operable to control the magnetic field sensor.

10. The interconnect module of claim 1, wherein the magnetic field sensor is secured to the metal clip by a spacer.

11. The interconnect module of claim 10, wherein the spacer is selected from the group consisting of: a polymer; a ceramic; silicon; glass; a non-conductive film; and a film.

12. The interconnect module of claim 10, wherein the spacer has a thickness such that the strength of the magnetic field which enters the magnetic field sensor is reduced to a non-destructive level.

13. A carrier assembly, comprising:
a carrier comprising a plurality of metal regions embedded in or attached to an electrically insulating material;
a first bare semiconductor die or packaged semiconductor die attached to a first one of the metal regions of the carrier; and
a first interconnect module, comprising:
a metal clip having a first end section, a second end section and a middle section extending between the first and the second end sections, the first end section being attached to the first metal region of the carrier or to the first bare semiconductor die or packaged semiconductor die, the second end section being attached to a second metal region of the carrier or to a second bare semiconductor die or packaged semiconductor die attached to the carrier; and
a magnetic field sensor secured to the metal clip, the magnetic field sensor operable to sense a magnetic field produced by current flowing through the metal clip,
wherein the metal clip is electrically connected to the bare semiconductor die or the packaged semiconductor die so that the eta clip and the bare semiconductor die or the packaged semiconductor die form part of a current pathway.

14. The carrier assembly of claim 13, wherein the magnetic field sensor is galvanically isolated from the metal clip.

15. The carrier assembly of claim 13, wherein the first interconnect module further comprises an encapsulant in which the metal clip is embedded, and wherein electrical contact pads disposed at a side of the magnetic field sensor facing away from the metal clip have a surface that is uncovered by the encapsulant.

16. The carrier assembly of claim 15, wherein a surface of the middle section of the metal clip facing away from the magnetic field sensor is covered by the encapsulant, wherein the first end section of the metal clip has a surface that is uncovered by the encapsulant and attached to the first metal region of the carrier or to the first bare semiconductor die or packaged semiconductor die, and wherein the second end section of the metal clip has a surface that is uncovered by the encapsulant and attached to the second metal region of the carrier or to the second bare semiconductor die or packaged semiconductor die.

17. The carrier assembly of claim 15, wherein the first interconnect module further comprises a metal redistribution layer embedded in the encapsulant and separated from the metal clip, and wherein the carrier assembly further comprises:
    a plurality of electrical conductors connecting different ones of the metal regions of the carrier to the metal redistribution layer of the first interconnect module.

18. The carrier assembly of claim 13, wherein the middle section of the metal clip of the first interconnect module comprises a first leg and a second leg spaced apart from the first leg, and wherein the magnetic field sensor of the first interconnect module comprises a first magnetic field sensing component adjacent the first leg and positioned so that a magnetic field produced by current flowing in the first leg impinges on the first magnetic field sensing component in a first direction and a second magnetic field sensing component adjacent the second leg and positioned so that the magnetic field impinges on the second magnetic field sensing component in a second direction different than the first direction.

19. The carrier assembly of claim 18, wherein the first bare semiconductor die or packaged semiconductor die is a lateral transistor device with all power terminals at a side facing the first interconnect module, wherein the first leg of the first interconnect module provides a direct electrical connection between a first one of the power terminals the second metal region of the carrier, and wherein the second leg of the first interconnect module provides a direct electrical connection between a second one of the power terminals and a third one of the metal regions of the carrier.

20. The carrier assembly of claim 18, wherein the first bare semiconductor die or packaged semiconductor die is a vertical transistor device with a first power terminal attached to the first metal region of the carrier and a second power terminal at a side facing the first interconnect module, wherein the first leg of the first interconnect module provides a direct electrical connection between the first and the second metal regions of the carrier, and wherein the second leg of the first interconnect module provides a direct electrical connection between the second power terminal and a third one of the metal regions of the carrier.

21. The carrier assembly of claim 13, wherein the first end section of the metal clip of the first interconnect module is attached to the first bare semiconductor die or packaged semiconductor die and the second end section of the metal clip of the first interconnect module is attached to the second bare semiconductor die or packaged semiconductor die, so as to provide a direct electrical connection between the first bare semiconductor die or packaged semiconductor die and the second bare semiconductor die or packaged semiconductor die.

22. The carrier assembly of claim 13, wherein the first end section of the metal clip of the first interconnect module is attached to the first metal region of the carrier and the second end section of the metal clip of the first interconnect module is attached to the second metal region of the carrier, so as to provide a direct electrical connection between the first and the second metal regions of the carrier.

23. The carrier assembly of claim 13, wherein the magnetic field sensor of the first interconnect module is secured to the metal clip by a spacer.

24. The carrier assembly of claim 13, wherein the first end section of the metal clip of the first interconnect module is attached to the first bare semiconductor die or packaged semiconductor die and the second end section of the metal clip of the first interconnect module is attached to the second metal region of the carrier, so as to provide a direct electrical connection between the first semiconductor die or packaged semiconductor die and the second metal region of the carrier, and wherein the carrier assembly further comprises:
    a second interconnect module, comprising:
        a metal clip having a first end section, a second end section and a middle section extending between the first and the second end sections, the first end section being attached to the second bare semiconductor die or packaged semiconductor die and the second end section being attached to a third metal region of the carrier, so as to provide a direct electrical connection between the second bare semiconductor die or packaged semiconductor die and the third metal region of the carrier; and
        a magnetic field sensor secured to the metal clip, the magnetic field sensor of the second interconnect module operable to sense a magnetic field produced by current flowing through the metal clip of the second interconnect module.

25. The carrier assembly of claim 13, further comprising a plurality of electrical conductors connecting different ones of the metal regions of the carrier to electrical contact pads disposed at a side of the magnetic field sensor facing away from the metal clip.

* * * * *

UNITED STATES PATENT AND TRADEMARK OFFICE
CERTIFICATE OF CORRECTION

PATENT NO. : 10,168,391 B2
APPLICATION NO. : 15/049923
DATED : January 1, 2019
INVENTOR(S) : G. Babulano et al.

Page 1 of 1

It is certified that error appears in the above-identified patent and that said Letters Patent is hereby corrected as shown below:

In the Claims

Column 23, Line 66 (Claim 4, Line 3) please change "by he" to -- by the --
Column 25, Line 44 (Claim 19, Line 6) please change "terminals the" to -- terminals and the --

Signed and Sealed this
Second Day of April, 2019

Andrei Iancu
*Director of the United States Patent and Trademark Office*